United States Patent
Miyajima

(10) Patent No.: US 6,643,498 B1
(45) Date of Patent: Nov. 4, 2003

(54) WIRELESS RECEIVER, WIRELESS RECEIVING METHOD, AND RECORDING MEDIUM

(75) Inventor: Yoshinori Miyajima, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/535,728

(22) Filed: Mar. 27, 2000

(30) Foreign Application Priority Data

Mar. 29, 1999 (JP) .......................................... 11-086463

(51) Int. Cl.$^7$ ................................................ H04B 7/00
(52) U.S. Cl. .................. 455/230; 455/232.1; 455/240.1
(58) Field of Search .................................... 455/219, 220, 455/226.2–230, 232.1, 234.1, 239.1, 240.1, 241.1, 242.1, 245.1, 245.2, 254; 453/39, 70, 136, 131, 334

(56) References Cited

U.S. PATENT DOCUMENTS

| | | | | | |
|---|---|---|---|---|---|
| 4,048,655 | A | * | 9/1977 | Hofmann | 348/544 |
| 4,480,335 | A | * | 10/1984 | Kishi | 455/212 |
| 4,674,121 | A | * | 6/1987 | Miura et al. | 381/10 |
| 5,692,019 | A | * | 11/1997 | Chang et al. | 375/347 |
| 5,880,631 | A | * | 3/1999 | Sahota | 330/51 |
| 5,930,693 | A | * | 7/1999 | Kennedy et al. | 455/234.1 |
| 6,374,097 | B1 | * | 4/2002 | Kudou | 455/232.1 |
| 6,404,775 | B1 | * | 6/2002 | Leslie et al. | 370/466 |

* cited by examiner

Primary Examiner—William Trost
Assistant Examiner—Congvan Tran
(74) Attorney, Agent, or Firm—Pearne & Gordon LLP

(57) ABSTRACT

A signal processing unit 107 outputs a control parameter of a gain control operation-starting electric field strength value in the form of a signal CN1 in correspondence with data of transfer speed/number of FM level by referring to a memory 108. Then, this signal processing unit 107 controls setting of an Received Signal Strength Indicator 105. When an electric field strength of a signal reaches an operation-starting electric field strength value, the Received Signal Strength Indicator (RSSI) 105 changes a voltage of an output GC1 based upon the control parameter (signal CN1). A gain control circuit 106 changes a gain control amount in response to the output signal GC1 derived from the Received Signal Strength Indicator 105. As a consequence, the operation-starting electric field strength value of the AGC operation can be set under optimum condition in correspondence with the sort of signal.

21 Claims, 16 Drawing Sheets

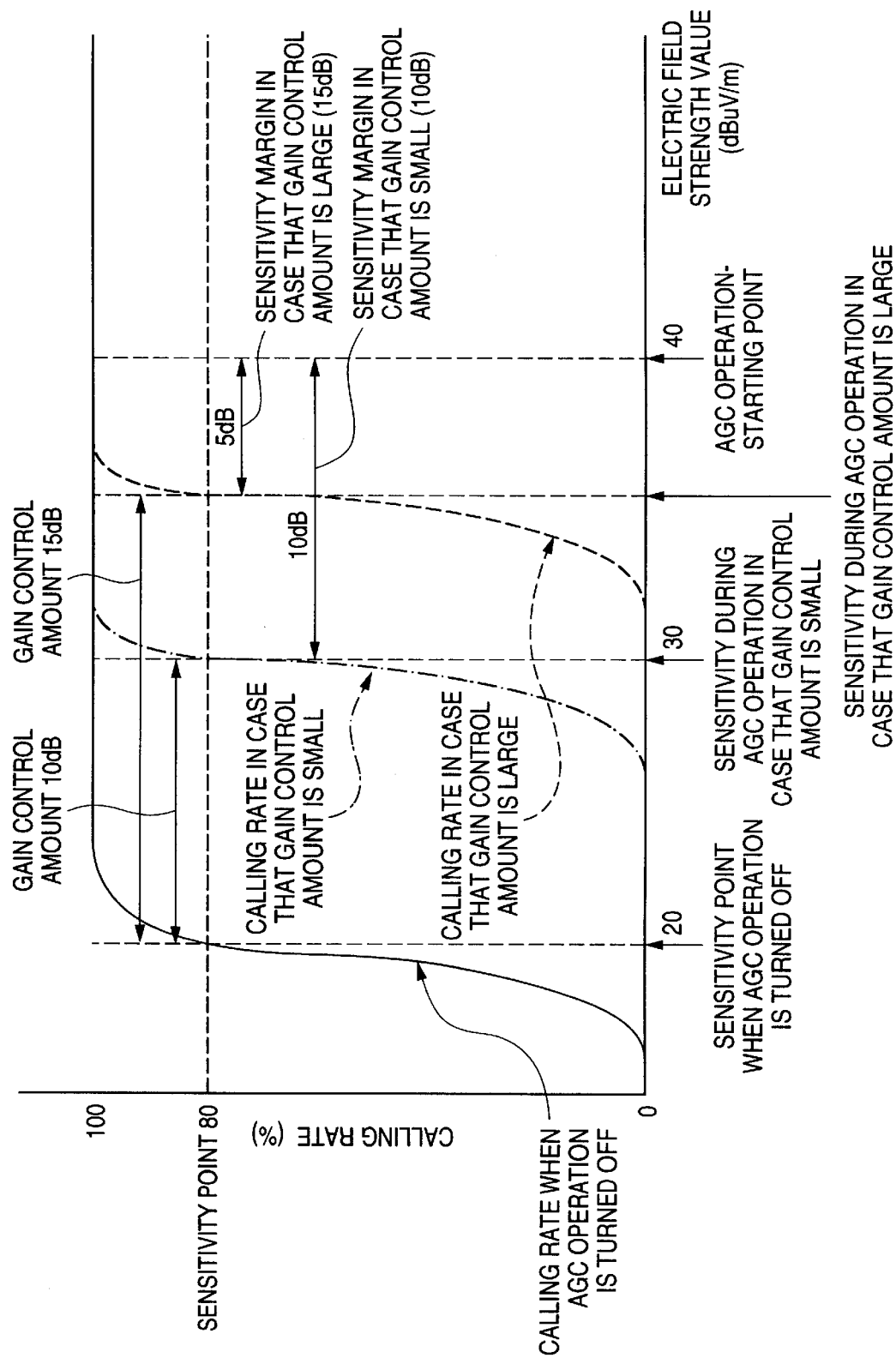

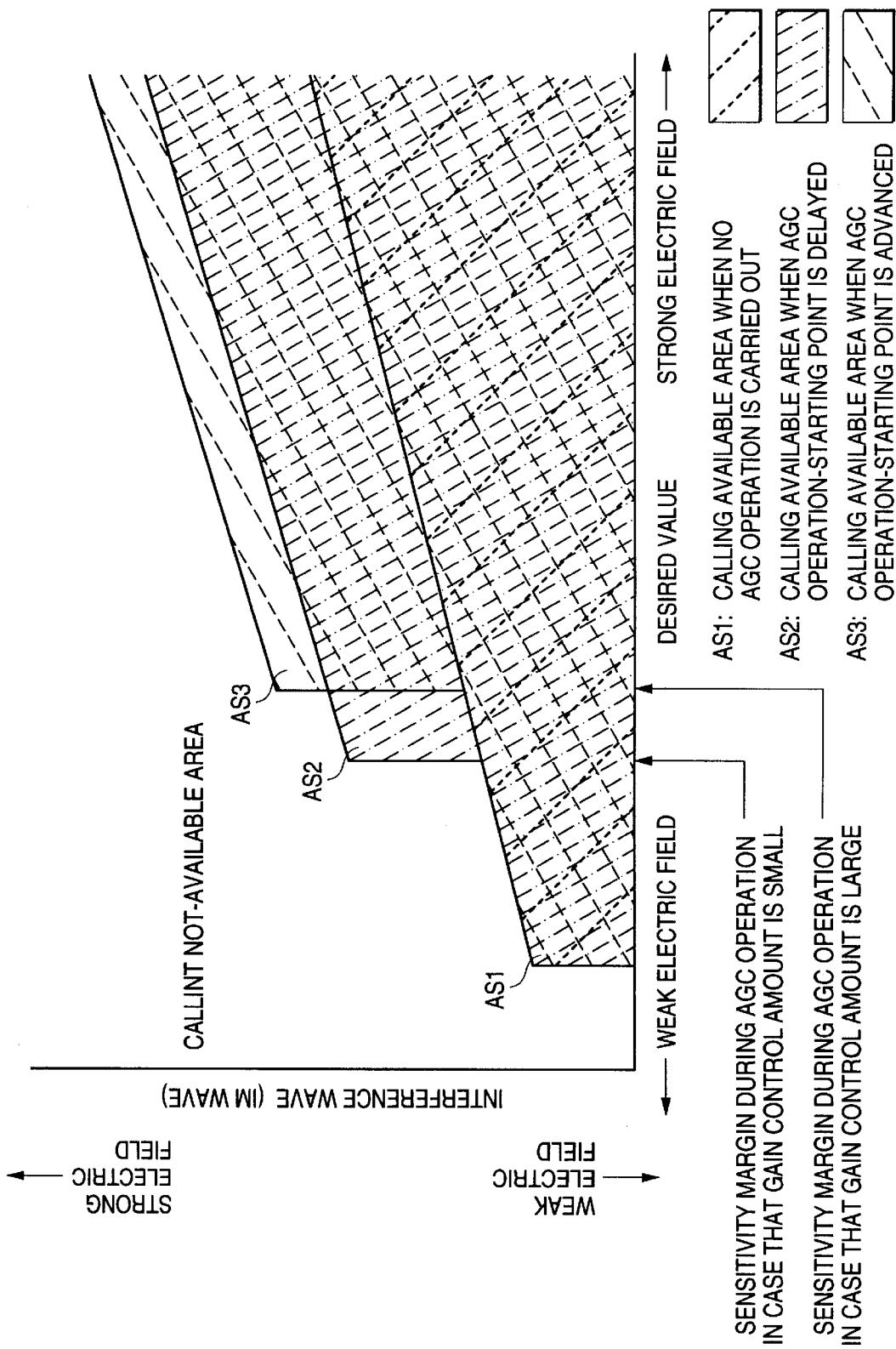

WIRELESS RECEIVER, WIRELESS RECEIVING METHOD, AND RECORDING MEDIUM

BACKGROUND OF THE INVENTION

The present invention is related to a wireless receiver, a wireless receiving method, and a recording medium for recording thereon a program used to execute this wireless receiving method. More specifically, the present invention is directed to such a wireless receiver equipped with a stepped gain control type automatic gain control circuit, or a continuous gain control type automatic gain control circuit, and also directed to such wireless receiving method/recording medium used with the wireless receiver. The stepped gain control type automatic gain control circuit changes the gain only by a predetermined amount when a signal level of a reception signal exceeds a preselected level. The continuous gain control type automatic gain control circuit changes the gain in response to a signal level of a reception signal.

In presently available wireless (radio) receivers such as pagers, while automatic gain control circuits are mounted, gains of these automatic gain control circuits are controlled, so that intermodulation sensitivity suppression (will be abbreviated as an "IM" hereinafter) characteristics and over-input characteristics of these wireless receivers may be improved. Presently, there are two sorts of automatic gain control circuits. That is, in a so-called "continuous gain control type" automatic gain control circuit, a gain control amount is varied in response to a signal level of a signal entered into a wireless receiver (radio receiver). In a so-termed "stepped gain control type" automatic gain control circuit, when a signal level of a signal entered into a wireless receiver exceeds a certain constant level, a preselected amount of gain is controlled.

First, a conventional wireless receiver equipped with a continuous gain control type automatic gain control circuit will now be explained with reference to FIG. 12 and FIG. 13. FIG. 12 is a structural diagram for showing the conventional wireless receiver equipped with the continuous gain control type automatic gain control circuit (first prior art).

In FIG. 12, the wireless receiver of the first prior art is arranged by employing an antenna 501, a low noise signal amplifier (LNA) 502, a local oscillator circuit 503, a frequency converting circuit 504, a Received Signal Strength Indicator (RSSI) 505, and a gain control circuit 506

The antenna 501 receives a signal transmitted from a base station (not shown). The low noise signal amplifier 502 amplifies the signal received by the antenna 501. The frequency converting circuit 504 performs the signal converting operation by multiplying the signal amplified by the low noise signal amplifier 502 by the signal of the local oscillator circuit 503. The Received Signal Strength Indicator (RSSI) 505 changes a voltage of an output signal GC5 in response to a signal level of an intermediate frequency signal IF after being frequency-converted. The gain control circuit 506 changes a control amount of a gain in response to the output signal GC5 outputted from the Received Signal Strength Indicator 505.

When a level of a signal entered to the antenna 501 is changed, the signal level of the intermediate frequency signal IF which is frequency-converted by the frequency converting circuit 504 is changed in response to this signal level change. Then, the voltage of the output signal GC5 of the Received Signal Strength Indicator 505 is varied in response to the level change of the signal IF which is frequency-converted by the frequency converting circuit 504, so that the gain control amount of the gain control circuit 506.

In other words, while the automatic gain control circuit is operated, when the signal level of the signal entered into the antenna 501 is high (namely, when electric field strength is strong), the gain control amount is increased, whereas when the signal level thereof is low (namely, when electric field strength is weak), the gain control amount is decreased. As previously explained, since the gain control amount will be changed in response to the signal level, the signal level of the intermediate frequency signal IF after being frequency-converted may be kept substantially constant until the gain control amount reaches the limit value and then becomes saturated. In this case, in such a case that the electric field strength changing width of the wireless signal entered into the antenna 501 while the automatic gain control circuit is operated is larger than, or equal to a difference (namely, sensitivity margin when AGC operation is active) between the sensitivity and the operation-starting electric field strength value of the automatic gain control (will be abbreviated as an "AGC" hereinafter) operation, and furthermore, the signal level is varied at such a pitch higher than the following speed with respect to the signal level change in the AGC operation, the electric field strength becomes lower than, or equal to the sensitivity point when the signal level is dropped. As a result, it is required to secure the sufficiently large sensitivity margin while the AGC operation is carried out.

FIG. 13 is an explanatory diagram for explaining a relationship between an operation-starting electric field strength value of an AGC operation, and both sensitivity margin when the AGC operation is performed and an IM characteristic in the continuous gain control type automatic gain control circuit.

When the operation-starting electric field strength value of the AGC operation of the automatic gain control circuit is a low level, although a calling available area (AR3) in the IM characteristic is increased, since the sensitivity margin is small when the AGC operation is performed, the AGC operation is weakened with respect to the field strength variation of the desirable electromagnetic wave. Also, when the operation-starting electric field strength value of the AGC operation of the automatic gain control circuit is a high level, although a calling available area (AR2) in the IM characteristic which can be improved by the automatic gain control circuit is decreased, since the sensitivity margin is made large when the AGC operation is performed, the AGC operation is strengthened with respect to the field strength variation of the desirable electromagnetic wave. As explained above, the operation-starting electric field value of the AGC operation must be set by considering both the IM characteristic and the sensitivity margin when the AGC operation is carried out.

Next, another conventional wireless receiver equipped with a stepped gain control type automatic gain control circuit will now be explained with reference to FIG. 14 to FIG. 16. FIG. 14 is a structural diagram for showing the conventional wireless receiver equipped with the stepped gain control type automatic gain control circuit (second prior art).

In FIG. 14, the wireless receiver of the second prior art is arranged by employing an antenna 601, a low noise signal amplifier (LNA) 602, a local oscillator circuit 603, a frequency converting circuit 604, a Received Signal Strength Indicator (RSSI) 605, and a gain control circuit 606.

When a signal level of an intermediate frequency signal IF which is frequency-converted by the frequency converting circuit 604 becomes higher than, or equal to a predetermined value, the Received Signal Strength Indicator (RSSI) 605 changes a signal GC6 to output the changed signal. The operation condition (ON-condition/OFF-condition) of the gain control circuit 606 is switched in response to the signal GC6 derived from the Received Signal Strength Indicator 605.

In this case, the gain control amount controlled by the gain control circuit 606 is made constant irrespective of a level of a signal entered from the antenna 601. Also, since a large amount of gains are instantaneously controlled within one time in the stepped gain control type automatic gain control circuit, large noise may be produced when the gain is controlled (switched). As a result, normally, both the field strength detecting operation and the gain switching operation are completed within a synchronization portion of a signal, and the gain switching operation is not carried out within a data section.

Also, in the case that an electric field variation width of a wireless signal entered into the antenna 601 is higher than, or equal to a difference (namely, sensitivity margin when AGC operation is carried out) between the operation-starting field strength value of the AGC operation and the sensitivity when the AGC operation is carried out, it is so judged that the signal level is high when the electric field strength is detected, namely high electric field. As a result, the automatic gain control circuit is caused to be operated. Since it is conceivable that the electric field strength is dropped lower than, or equal to the sensitivity point when the AGC operation is carried out in the data section and therefore the transmitted data cannot be received, the sufficient sensitivity margin when the AGC operation is carried out must be secured.

FIG. 15 is an explanatory diagram for representing a relationship among an AGC operation-starting electric field strength value, a gain control amount, and a calling rate in the stepped gain control type automatic gain control circuit. It should be understood that in this drawing, a calling rate of 80 [%] is defined as a sensitivity point.

When the gain control amount is increased so as to increase a gain-lowering amount, a sensitivity point when the AGC operation is performed is deteriorated in connection with increasing of this gain-lowering amount. For example, as shown in FIG. 15, the following two cases will now be considered in such a case that the static sensitivity of the automatic gain control circuit is turned OFF (namely, non-operation state) is equal to 20 [dB$\mu$V/m], namely the gain control amount is set to 10 [dB], and is set to 15 [dB]. When the gain control amount is selected to be 10 [dB], namely small, the static sensitivity achieved while the AGC operation is performed is deteriorated by 10 [dB] to thereby become 30 [dB$\mu$V/m]. When the gain control amount is selected to be 15 [dB], namely large, the static sensitivity achieved while the AGC operation is carried out is deteriorated by 15 [dB] to thereby become 35 [dB$\mu$V/m].

In the case that an AGC operation-starting electric field strength value is set to 40 [dB$\mu$V/m] in a static electric field, when the gain control amount is selected to be 10 [dB], the sensitivity margin achieved when the AGC operation is performed is 10 [dB], whereas when the gain control amount is selected to be 15 [dB], the sensitivity margin achieved when the AGC operation is performed is 5 [dB]. As previously explained, when the AGC operation-starting electric field strength value is the same, the larger the AGC gain control amount is made, the lower the sensitivity margin achieved when the AGC operation is performed becomes.

FIG. 16 is an explanatory diagram for representing a relationship among an AGC operation-starting electric field strength value, a gain control amount, and a calling available area in an IM characteristic in the stepped gain control type automatic gain control circuit. Considering now that the AGC operation-starting electric field strength is the same, when the gain control amount is increased, the calling available area on the IM characteristic is increased from "AS2" to "AS3" by way of the automatic gain control circuit, whereas when the gain control amount is conversely decreased, the calling available area on the IM characteristic is reduced by way of the automatic gain control circuit. As previously explained, also in this stepped gain control type automatic gain control circuit, the automatic gain control circuit must be set by considering both the sensitivity margin and the IM characteristic when the AGC operation is carried out.

However, in the above-explained conventional wireless receiver, although the reception sensitivities of the wireless receiver are different from each other under the transmission conditions (transfer speeds and number of FM levels) of the transmission signals, the automatic gain control circuits under all of such transfer speeds and all of the number of FM levels are set under the same setting conditions.

For instance, the following assumption is made in an FLEX type pager. That is to say, a sensitivity of the best sensitivity at 1,600 [bps/2-Level FM] is 16 [dB$\mu$V/m]; and a sensitivity of the worst sensitivity at 6,400 [bps/4-Level FM] is 20 [dB$\mu$V/m], namely there is a difference of 4 [dB] between both the sensitivities. In such a case that a wireless receiver equipped with the continuous gain control type automatic gain control circuit, when sensitivity margin while an AGC operation is performed requires 10 [dB] as minimum margin by considering a variation in electric fields, this wireless receiver must be set so as to secure 10 [dB] in the worst sensitivity at 6,400 [bps/4-Level FM].

However, since the sensitivity margin when the AGC operation is carried out owns 14 [dB] in the sensitivity at 1,600 [bps/2-Level FM], even when the AGC operation-starting electric field strength value at 1,600 [bps/2-Level FM] is set to such a lower electric field level than the AGC operation-starting electric field strength value at 6,400 [bps/4-Level FM] by 4 [dB], the sensitivity margin may be secured by 10 [dB] while the AGC operation is carried out. Since the AGC operation-starting electric field strength value is set to be further low electric field levels, the calling rate in the area on the IM characteristic can be furthermore improved.

Similar to another wireless receiver equipped with the stepped gain control type automatic gain control circuit, assuming now that the AGC operation-starting electric field strength value is 40 [dB$\mu$V/m], the sensitivity at 1,600 [bps/2-Level FM] and the sensitivity at 6,400 [bps/4-Level FM] while the AGC operation is carried out are 26 [dB$\mu$V/m] and 30 [dB$\mu$V/m], the sensitivity margin while the AGC operation is performed as to 1,600 [bps/2-Level FM], and 6,400 [bps/4-Level FM] becomes 14 [dB] and 10 [dB], respectively.

When it is acceptable that as the sensitivity margin while the AGC operation is carried out, 10 [dB] is maintained at minimum the following possibilities may occur. That is, while the AGC operation starting electric field value is set to be lowered by 4 [dB], the calling rate in the area with respect to the IM characteristic may be furthermore improved. Also, in the case of the better sensitivity, at 1,600 [bps/2-Level FM], even when such a larger gain control amount than that for 6,400 [bps/4-Level FM] by 4 [dB] equal to the sensitivity difference is applied, the same sensitivity margin while the AGC operation is carried out can be obtained. As a consequence, there are certain possibilities that while the large gain control amount is set, the calling rate in the area on the IM characteristic can be furthermore improved.

As previously explained, the optimum setting conditions of the automatic gain control circuit will differ from each other, depending upon the transfer speed of the reception signal and the number of FM level. However, in the conventional wireless receiver, there is no means capable of individually setting the automatic gain control circuit in accordance with the respective transfer speeds and the respective number of FM levels. Thus, since the automatic gain control circuit is operated under the same setting conditions (namely operation-starting electric field strength values and gain control amount) as to all of the transfer speeds and the number of FM levels, this automatic gain control circuit cannot be continuously set under optimum conditions.

SUMMARY OF THE INVENTION

The present invention has been made to solve the above-explained problems occurred in the conventional wireless receivers, and therefore, has an object to provide a wireless receiver capable of setting an automatic gain control circuit under optimum conditions with respect to the respective transfer speeds of reception signals and the respective number of FM levels thereof by selectively switching an operation-starting electric field value and also a gain control amount of this automatic gain control circuit in response to the transfer speeds and the number of FM levels of the reception signals. Thus, the wireless receiver is capable of improving a calling rate under such an environment as a strong electric field IM which may cause a problem in the actual field. Also, the present invention has another object to provide a wireless receiving method and a recording medium, while using such a wireless receiver.

To solve the above-described problem, a wireless receiver, according to the first aspect of the present invention, is featured by comprising: gain control means for controlling a gain of the wireless receiver; received signal strength detecting means for detecting an electric field strength of a reception signal; operation-starting electric field strength value determining means for determining an operation-starting electric field strength value by which the gain control operation of the gain control means is commenced in response to a transfer speed of the reception signal and a number of FM level of the reception signal; and first control means for causing the gain control means to commence the gain control operation when an electric field strength detected by the received signal strength detecting means reaches the operation-starting electric field strength value.

In the wireless receiver, the wireless receiving method, and the recording medium according to the first aspect of the present invention, the operation-starting electric field strength value determining means (operation-starting electric field strength value determining step) of the automatic gain control circuit determines the operation-starting electric field strength value by which the gain control operation of the gain control means is commenced in response to the transfer speed of the reception signal and the number of FM level of the reception signal; and the first control means (first control step) causes the gain control means to commence the gain control operation when the electric field strength detected by the received signal strength detecting means reaches the operation-starting field strength value.

More specifically, in the wireless receiver of the first aspect of the present invention, while the gain control means is constructed of the stepped gain control type gain control means, when the electric field strength reaches the operation-starting electric field strength value, the gain is changed only by a predetermined amount if the signal level of the reception signal exceeds a preselected level. Also, in the wireless receiver according to the first aspect of the present invention, while the gain control means is constructed of the continuous gain control type gain control means, when the electric field strength reaches the operation-starting electric field value, the gain is changed in response to the signal level of the reception signal.

For instance, in the case of an FLEX protocol pager, 4 different combinations may be conducted as a combination between a transfer speed and a number of FM level, namely 1,600 [bps/2-level FM], 3,200 [bps/2-level FM], 3,200 [bps/4-level FM], and also 6,400 [bps/4-level FM]. Since the information for discriminating these items is contained in the synchronization data and is received, the CPU decodes this information to determine the operation-starting electric field strength of the gain control means in response to the transfer speed of the reception signal and the number of FM level thereof. As a consequence, the operation-starting electric field strength value of the gain control means can be set under optimum condition, depending upon the sort of reception signal. It is possible to provide the FLEX protocol pager capable of furthermore improving the calling rate under such an environment as the strong electric field IM which causes the problem in the actual field.

Also, in the wireless receiver according to the first aspect of the present invention, the comparing means of the first control means compares the received signal strength detected by the electric field strength detecting means with a preselected reference value, and the preselected reference voltage of the comparing means is selectively set in response to the transfer speed of the reception signal and the number of FM level thereof. In this case, the reference voltage of the comparing means can be selectively set in response to the transfer speed of the reception signal and the number of FM level thereof.

As previously described, since the reference voltage of the comparing means is selectively set, the operation-starting electric field value of the gain control means can be set in correspondence with the transfer speed of the reception signal and the number of FM level thereof. As a result, the automatic gain control operation-starting electric field strength value can be set under optimum condition, depending upon the sort of signal.

Also, in the wireless receiver according to the first aspect of the present invention, the variable gain amplifier of the first control means amplifies the reception signal by a predetermined gain to supply the amplified reception signal to the received signal strength detecting means.

In this case, the predetermined gain of this variable gain amplifier is selectively set in response to the transfer speed of the reception signal and the number of FM level thereof.

As explained above, since a predetermined gain of the variable gain amplifier is selectively set, the operation-starting electric field value of the gain control means can be shifted in correspondence with the transfer speed of the reception signal and the number of FM level thereof. As a result, the automatic gain control operation-starting electric field strength value can be set under optimum condition, depending upon the sort of signal.

Also, in the wireless receiver according to the first aspect of the present invention, the converting means of the first control means converts the output of the received signal strength detecting means into the voltage level at a predetermined rate. In this case, the predetermined rate of the converting means is selectively set in response to the transfer speed of the reception signal and the number of FM level thereof. For example, when the received signal strength detecting means is a current output, the converting means corresponds to a current-to-voltage converting means.

As previously explained, since the predetermined rate of the converting means is selectively set, the operation-starting electric field value of the gain control means can be shifted in correspondence with the transfer speed of the reception signal and the number of FM level thereof. As a result, the automatic gain control operation-starting electric field strength value can be set under optimum condition, depending upon the sort of signal.

Also, a wireless receiver, according to the second aspect of the present invention, is featured by comprising: gain control means for controlling a gain of the wireless receiver; gain control amount determining means for determining a gain control amount of the gain control means in response to a transfer speed of a reception signal and a number of FM level of the reception signal; and second control means for changing the gain of the gain control means in response to the gain control amount.

Also, in the wireless receiver, the wireless receiving method, and the recording medium according to the second aspect of the present invention, gain control amount determining means (gain control amount determining step) for determines the gain control amount of the gain control means in response to the transfer speed of the reception signal and the number of FM level of the reception signal, and the second control means (second control step) changes the gain of the gain control means in response to the gain control amount. More specifically, in the wireless receiver according to the second aspect of the present invention, the gain control means is the stepped gain control type gain control means for changing the gain only by the predetermined gain amount when the signal level of the reception signal exceeds a predetermined level.

As previously explained, since the gain control amount of the gain control means is determined in response to the transfer speed and the number of FM level, the gain control amount can be set under optimum condition, depending upon the sort of reception signal. It is possible to provide the wireless receiver, the wireless receiving method, and the recording medium, capable of furthermore improving the calling rate under such an environment as the strong electric field IM which causes the problem in the actual field.

Also, in the wireless receiver according to the second aspect of the present invention, the distributing means of the gain control means distributes the reception signal received from the antenna to both the signal amplifying means and another signal path, and second control means changes the distribution ratio of the reception signal with respect to the signal amplifying the reception signal with respect to the signal amplifying means in the distributing means in response to the transfer speed of the reception signal and the number of FM level thereof.

In this case, the term "another signal path" implies, for example, a path defined from the antenna to the ground. The distribution ratio of the reception signal flowing through this path is varied, depending upon the transfer speed of the reception signal and the number of FM level thereof. As a result, since the gain control amount can be selected, the gain control amount of the automatic gain control operation can be set under optimum condition, depending upon the sort of signal.

Also, in the wireless receiver according to the second aspect of the present invention, the output voltage of the output voltage switching circuit can be selectively set with respect to the signal amplifying means whose gain is controlled by this output voltage switching circuit, so that the gain of the reception signal is controlled. The second control means controls the gain of the signal amplifying means by selectively setting the output voltage of the output voltage switching circuit in response to the transfer speed of the reception signal and the number of FM level thereof.

As previously explained, the gain of the signal amplifying means can be controlled in response to the transfer speed of the reception signal and the number of FM level thereof by selectively setting the output voltage of the output voltage switching circuit. As a result, the gain control amount of the automatic gain control operation can be set under optimum condition, depending upon the sort of signal.

Also, in the wireless receiver according to the second aspect of the present invention, the reception signal is amplified by the signal amplifying means equipped with the current source having the current switching function of the gain control means, and also the second control means selectively sets the current value of the current source having the current switching function of the signal amplifying means in response to the transfer speed of the reception signal and the number of FM level thereof.

As explained above, since the current of the signal amplifying means can be controlled in accordance with the transfer speed of the reception signal and the number of FM level thereof by selectively setting the current value of the current source equipped with the current switching function employed in the signal amplifying means, the gain control amount of the gain control means can be essentially switched. As a result, the gain control amount of the automatic gain control operation can be set under optimum condition, depending upon the sort of signal.

Also, in the wireless receiver, the wireless receiving method, and the storage medium according to the present invention, storage means stores thereinto the parameter in response to the transfer speed of the reception signal and the number of FM level thereof, and this parameter may set/control the operation-starting electric field strength value, the gain control amount, the predetermined reference voltage of the comparing means, the predetermined gain of the variable gain amplifier, the preselected rate of the converting means, the distribution ratio of the distributing means to the signal amplifying means, the output voltage of the gain controlling output voltage switching circuit of the signal amplifying means, or the current value selection of the current source having the current switching function of the signal amplifying means.

While the control parameter produced in response to the transfer speed of the received signal and the number of FM level thereof is saved in the storage means, the operation-starting electric field strength value is set based on this control parameter. In this case, as the control parameter for setting the operation-starting electric field strength value, when the wireless receiver is arranged by the below-mentioned comparing means, this control parameter selectively sets a predetermined reference voltage of this comparing means. That is, in this wireless receiver, for instance, the comparing means compares the detected electric field strength with the reference voltage, and when the detected electric field strength reaches this reference voltage, the gain control operation of the gain control means is commenced with the gain responding to the electric field strength. Also, when. the wireless receiver is arranged in such a manner that the reception signal is amplified by the variable gain amplifier at a predetermined gain thereof and then the amplified reception signal is supplied to the number of received signal strength detecting means, the control parameter selectively sets the predetermined gain of the variable gain amplifier. Furthermore, when the wireless receiver is arranged in such a manner that the output of the number of received signal strength detecting means is converted into the voltage level in a preselected rate of the converting means, the control parameter selectively sets this preselected rate of the converting means.

Alternatively, the gain control amount of the gain control means is switched based upon the control parameter produced in accordance with the transfer speed and the number of FM level saved in the storage means, so that the gain control amount of the automatic gain control operation may be set. In this case, as the control parameter for setting the gain control amount, for example, when the wireless receiver is arranged in such a manner that the distributing means distributes the reception signal to both the signal amplifying means and another signal path, the control parameter selectively sets the distribution rate of the distributing means to the signal amplifying means. When the wireless receiver is arranged by such a signal amplifying means whose gain is controlled by the output voltage of the output voltage switching circuit, the control parameter selectively sets the output voltage of the output voltage switching circuit. Furthermore, when the wireless receiver is arranged by such a signal amplifying means equipped with the current source having the current switching function, the control parameter selectively sets the current value of the current source having the current switching function employed in the signal amplifying means.

As previously explained, since the control parameter is saved in the storage means, the automatic gain control operation-starting electric field strength value and the gain control amount can be set readily under optimum condition, depending upon the transfer speed and the number of FM level of reception signal. It is possible to furthermore improve the calling rage under such an environment as the strong electric field IM.

Furthermore, in the wireless receiver, the wireless receiving method, and the recording medium according to the present invention, the parameter of the storage means is individually adjusted based upon the gain characteristic of the wireless receiver, the intermodulation sensitivity suppressing characteristic thereof, or the electric field strength characteristic thereof. For instance, when the wireless receiver is shipped, the gain characteristic, the intermodulation sensitivity suppressing characteristic, and the electric field strength characteristic of this wireless receiver are individually tested. Then, when the parameter of the storage means is set based upon the fluctuations contained in these characteristics, the automatic gain control operation-starting electric field strength value and also the gain control amount can be set under optimum conditions in correspondence with the transfer speed of the reception signal and the number of FM level thereof in fit with the actual field state.

BRIEF DISCRIPTION OF THE DRAWINGS

FIG. 15 is an explanatory diagram for representing the relationship among the AGC operation-starting electric field strength value, the gain control amount, and the calling rate in the stepped gain control type automatic gain control circuit; and FIG. 16 is an explanatory diagram for representing the relationship among the AGC operation-starting electric field strength value, the gain control amount, and the calling available area in the IM characteristic in the stepped gain control type automatic gain control circuit.

DETAILED DISCRIPTION OF PREFERRED EMBODIMENTS

Referring now to drawings, various embodiment modes of a wireless receiver, a wireless receiving method, and a recording medium of the present invention will be described in detail in this order of [FIRST EMBODIMENT MODE], [SECOND EMBODIMENT MODE], and [THIRD EMBODIMENT MODE]. It should be understood that the wireless receiver and the wireless receiving method according to the present invention will be described in detail in the descriptions of the respective embodiment modes. As to the recording medium according to the present invention, since this recording medium corresponds to such a recording medium for recording thereon a program used to execute the wireless receiving method, the description of this recording medium is covered by the below-mentioned description about the wireless receiving method.

FIRST EMBODIMENT MODE

Figure 1:
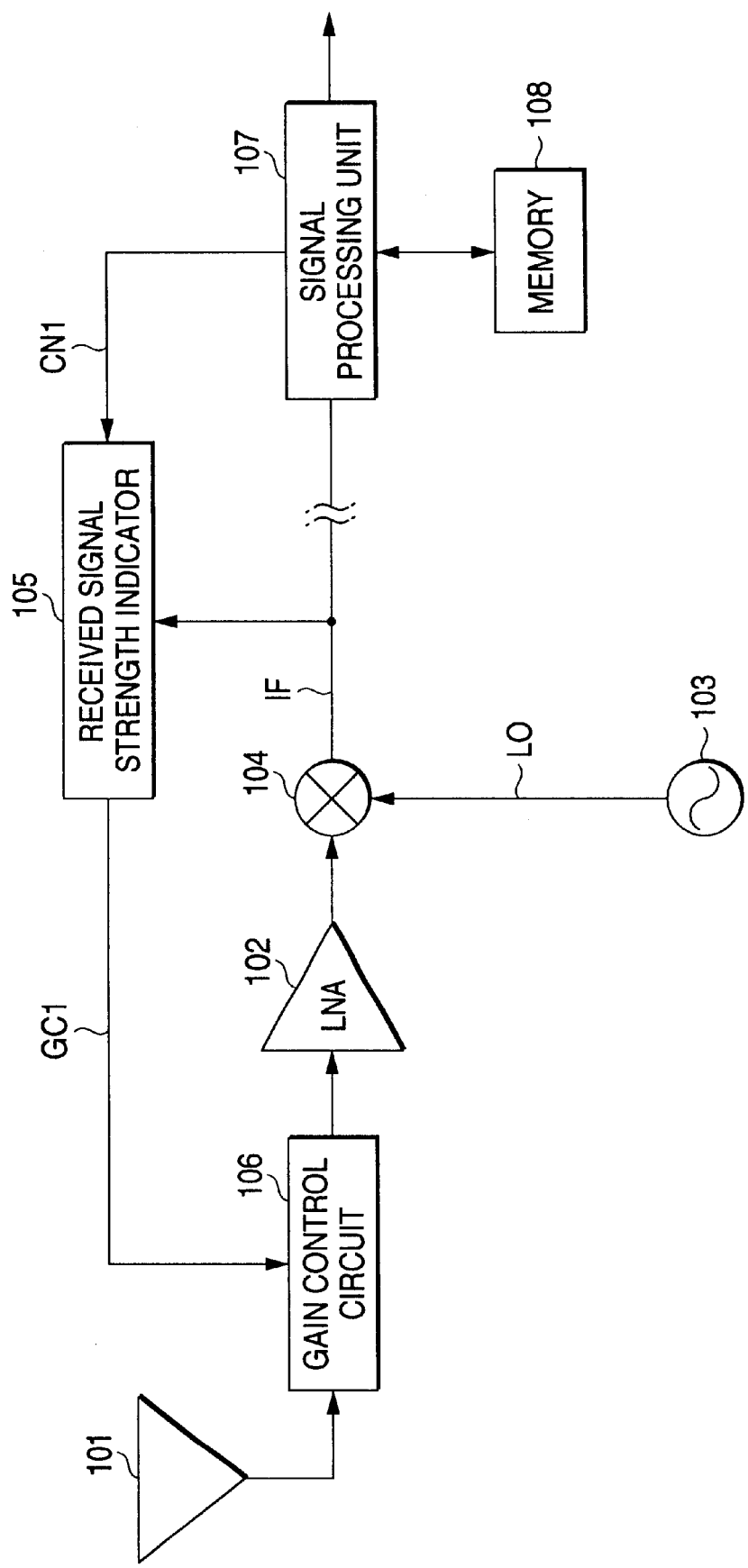
FIG. 1 is a structural diagram of a wireless receiver according to a first embodiment mode of the present invention.

FIG. 1 is a structural diagram for representing a wireless receiver (radio receiver) according to a first embodiment mode of the present invention.

In FIG. 1, the wireless receiver of the first embodiment mode is arranged by employing an antenna 101, a low noise signal amplifier (LNA) 102, a local oscillator circuit 103, a frequency converting circuit 104, a Received Signal Strength Indicator (RSSI) 105, a gain control circuit 106, a signal processing unit 107, and a memory 108.

The antenna 101 receives a signal transmitted from a base station (not shown). The low noise signal amplifier 102 amplifies the signal received by the antenna 101. The frequency converting circuit 104 performs the signal converting operation by multiplying the signal amplified by the low noise signal amplifier 102 by the signal of the local oscillator circuit 103.

The memory 108 corresponds to a storage means. The memory 108 stores thereinto a control parameter of an operation-starting electric field value of an automatic gain control (will be abbreviated as an "AGC" hereinafter). This AGC is set/controlled in response to a transfer speed of a reception signal and a number of FM level thereof. The memory 108 further stores thereinto the transfer speed of the reception signal, and the number of FM level thereof. Also, the signal processing unit 107 corresponds to an operation-starting field strength value determining means. This signal processing unit 107 decodes the reception signal so as to discriminate the transfer speed of the reception signal and the number of FM level thereof, and outputs a control parameter of an operation-starting electric field strength value in correspondence with the stored transfer speed data and the stored number of FM level data by referring to the storage content of the memory 108 in the form of a signal CN1. Then, the signal processing unit 107 controls the Received Signal Strength Indicator (RSSI) 105 by supplying the signal CN1 to this RSSI 105. Also, this signal processing unit 107 updates the transfer speed data and the number of FM level data, which are stored in the memory 108, in accordance with the transfer speed of the reception signal and the number of FM level thereof. It should be noted that this data update operation may be carried out every time a signal is received, or may be performed once every time signals are received several times.

Also, the Received Signal Strength Indicator (RSSI) 105 detecting electric field strength corresponds to both an received signal strength detecting means and a first control means. When in response to the control parameter (signal CN1) an electric field strength of a signal reaches the operation-starting electric field value, the Received Signal Strength Indicator (RSSI) 105 changes a voltage of an output signal GC1 in correspondence with a signal level of an intermediate frequency signal IF after being frequency-converted. Furthermore, the gain control circuit 106 changes a control amount of a gain in response to the output signal GC1 derived from the Received Signal Strength Indicator 105.

Next, an arrangement of the first control means and operation thereof will now be explained more in detail. This first control means changes the operation-starting electric field strength value of the AGC operation in correspondence with the transfer speed and the number of FM level of the reception signal.

In this embodiment mode, an FLEX protocol pager will be considered as an example. In this case, 4 different combinations may be conducted as a combination between a transfer speed and a number of FM level, namely 1,600 [bps/2-Level FM], 3,200 [bps/2-Level FM], 3,200 [bps/4-Level FM], and also 6,400 [bps/4-Level FM]. Service providers may change transfer speeds and number of FM levels of signals to be transmitted, depending upon rush conditions of traffics and the like while providing serves.

However, both the transfer speeds and the number of FM levels of the signals to be transmitted are not frequently changed, both the signals are being transmitted during a rather long time duration at the same transfer speeds and the same number of FM levels. In the case of the FLEX protocol signal, the synchronization signals "A" and "invA" of the synchronization portion of the signal are different from each other, depending upon both the transfer speed and the number of FM level. When either the synchronization signal "A" or the synchronization signal "invA" can be decoded, it is possible to judge that the transmission signal is transmitted at which transfer speed and under which number of FM level. As a result, both a transfer speed of a signal to be transmitted and a number of FM level thereof can be grasped by such a way that every time the information of both the transmission speed and the number of FM level of the received signal is received, since this received information is stored into the memory 108. Otherwise, every time this information of the transmission speed/number of FM level is received several times, this received information is stored in the memory 108.

As previously explained, the signal processing unit 107 decodes the reception signal so as to discriminate both the transfer speed and the number of FM level. Referring to the storage content of the memory 108, this signal processing unit 107 outputs such a control parameter of the operation-starting electric field strength value in correspondence with the transfer speed data and the number of FM level data stored in this memory 108 in the form of the signal CN1 so as to control setting of the Received Signal Strength Indicator (RSSI) 105. Subsequently, concrete embodiments of Received Signal Strength Indicator 105 employed in the wireless receiver according to this embodiment mode will now be explained in this order of [first embodiment], [second embodiment], and [third embodiment] with reference to drawings.

First embodiment

Figure 2:
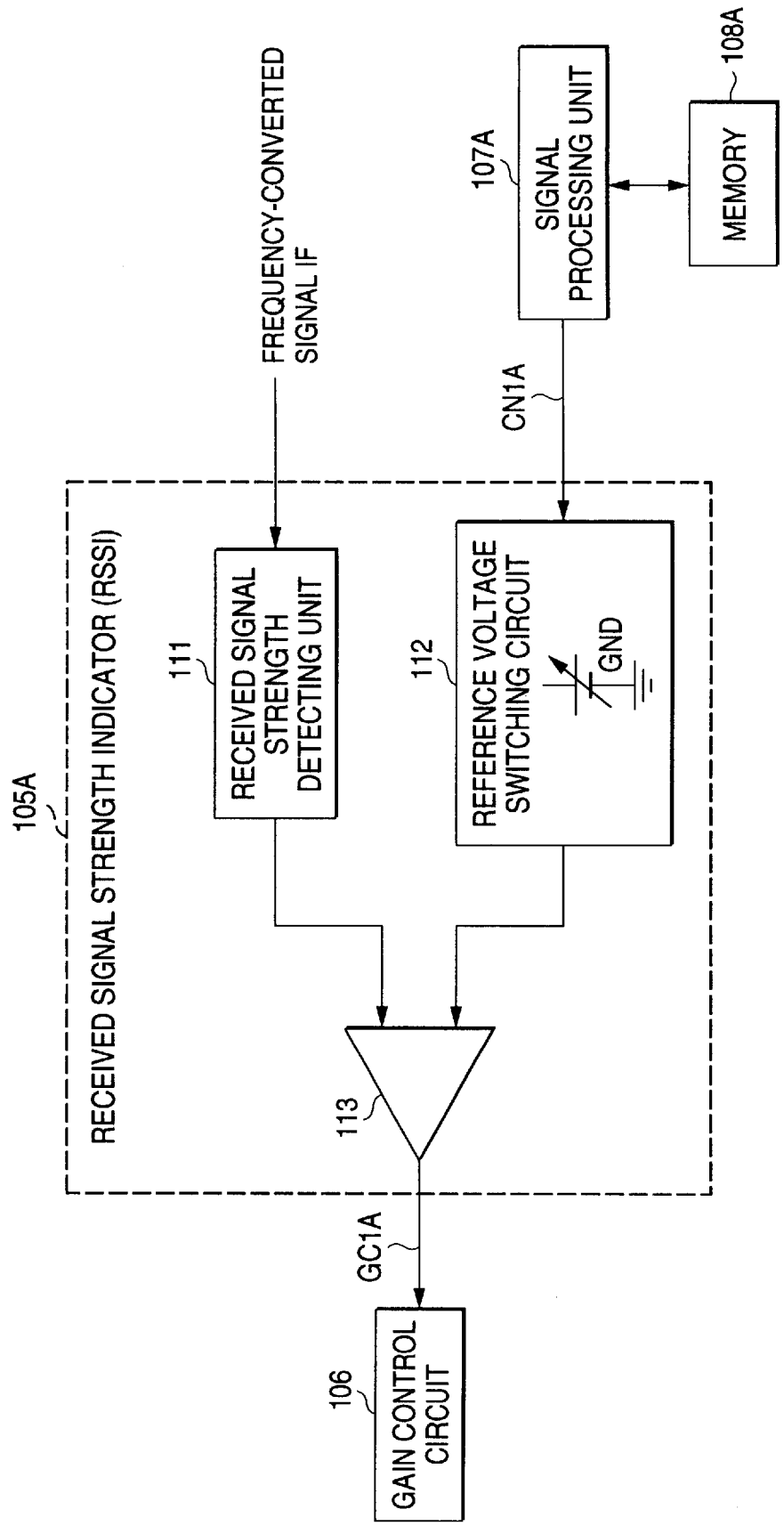
FIG. 2 is a concrete arrangement diagram of a Received Signal Strength Indicator (first embodiment) employed in the wireless receiver of the first embodiment mode.

In FIG. 2, there is shown a concrete arrangement diagram (first embodiment) of the Received Signal Strength Indicator 105 employed in the wireless receiver according to the first embodiment mode.

In FIG. 2, a Received Signal Strength Indicator (RSSI) 105A of the first embodiment is arranged by employing a received signal strength detecting unit (received signal strength detecting means) 111, a reference voltage switching circuit 112, and an operation-starting field strength value switching circuit (comparing means) 113.

The received signal strength detecting unit 111 detects an electric field strength of an intermediate frequency signal IF after being frequency-converted. This received signal strength detecting unit 111 owns such a characteristic that the voltage outputted from this detecting unit 111 is varied in response to a strength of a signal entered into this wireless receiver, and the output voltage is increased in accordance with such a trend that the signal strength is increased.

Also, in the reference voltage switching circuit 112, a reference voltage of the operation-starting field strength value of the AGC operation is switched in response to a control parameter (namely, signal CN1A) derived from the signal processing unit 107A.

Furthermore, the operation-starting field strength value switching circuit 113 compares the output voltage derived from the received signal strength detecting unit 111 with the reference voltage of the reference voltage switching circuit 112, and outputs a signal GC1A responding to the output signal of the received signal strength detecting unit 111 to the gain control circuit 106 when the output voltage of the received signal strength detecting unit 111 reaches the reference voltage.

In the case of this first embodiment, the reference voltage of the reference voltage switching circuit 112 is stored into the memory 108A, and this reference voltage corresponds to the operation-starting electric field strength value as the control parameter. In other words, the signal processing unit 107A reads out from the memory 108A, the control parameter corresponding to both the transfer speed and the number of FM level of the reception signal which has been previously received and decoded. Then, the signal processing unit 107A outputs this control parameter to the reference voltage switching circuit 112 provided inside the Received Signal Strength Indicator (RSSI) 105A in the form of a signal CN1A so as to switch the output voltage of the reference voltage switching circuit 112 (namely, reference voltage of operation-starting field strength value switching circuit 113).

The output voltage of the received signal strength detecting unit 111 is compared with the output voltage of the reference voltage switching circuit 112 in the operation-starting field strength value switching circuit 113. This output voltage of the received signal strength detecting unit 111 is varied in response to the strength of the signal entered into this wireless receiver. When, the output voltage of the received signal strength detecting unit 111 is higher than the reference voltage of the reference voltage switching circuit 112, the signal GC1A is outputted from the Received Signal Strength Indicator (RSSI) 105A to the gain control circuit 106. As previously described, in accordance with the arrangement of the first embodiment, the operation-starting electric field strength value of the AGC operation can be changed by switching the reference voltage of the reference voltage switching circuit 112.

Second Embodiment

Figure 3:
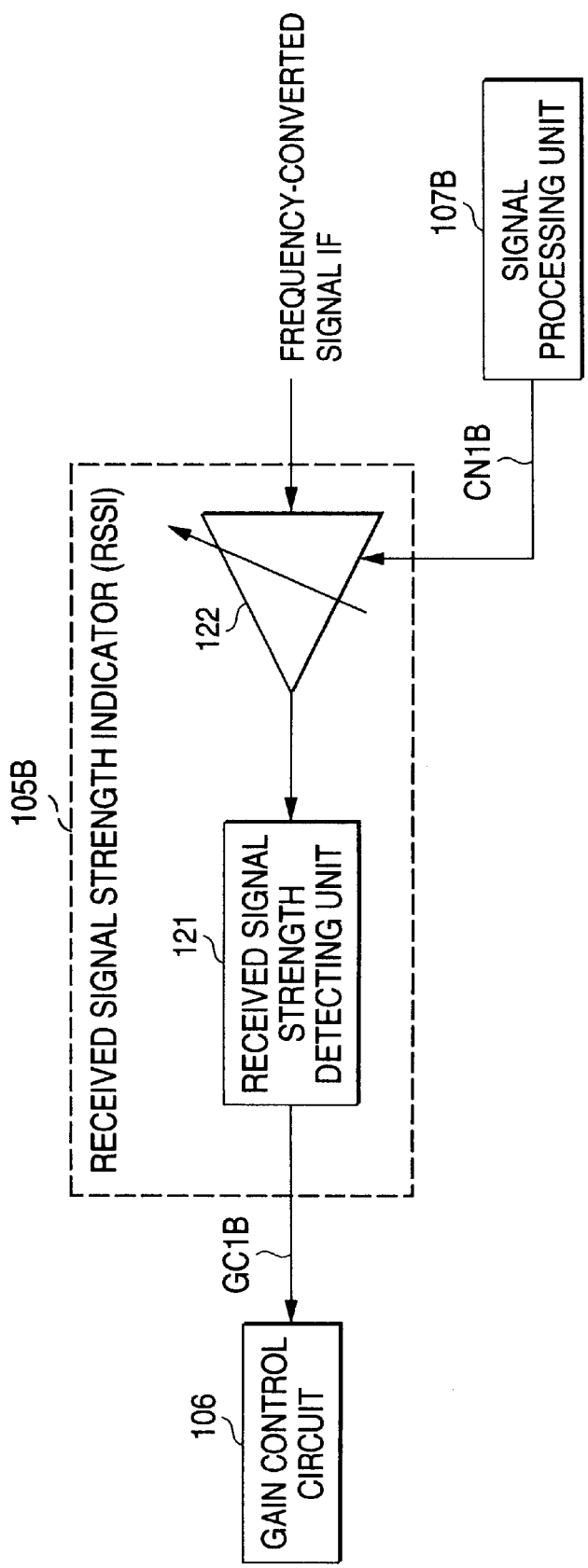
FIG. 3 is a concrete arrangement diagram of a Received Signal Strength Indicator (second embodiment) employed in the wireless receiver of the first embodiment mode.

Next, FIG. 3 shows a concrete arrangement diagram (second embodiment) of the Received Signal Strength Indicator 105 employed in the wireless receiver according to the first embodiment mode.

In FIG. 3, a Received Signal Strength Indicator (RSSI) 105B of the second embodiment is arranged by employing a variable gain amplifier 122 and an received signal strength detecting unit 121.

In the first embodiment, such an arrangement is exemplified that the operation-starting electric field strength value of the AGC operation is switched by switching the reference voltage. Alternatively, as represented in the second embodiment of FIG. 3, the output signal IF (namely, intermediate frequency signal after being frequency-converted) of the frequency converting circuit 104 is first amplified by the variable gain amplifier 122. Thereafter, this amplified signal IF is supplied to the Received Signal Strength Indicator 121. Thus, the operation-starting electric field value of the AGC operation may be switched by switching the gain of the variable gain amplifier 122 based upon a control parameter (signal CN1B) supplied from the signal processing unit 107B. In other words, the operation-starting electric field strength value of the AGC operation is shifted by selectively setting the gain of the variable gain amplifier 122. It should be noted that in the case of the second embodiment, the gain of the variable gain amplifier 122 is stored into the memory 108 (not shown in FIG. 3) as the control parameter for setting the operation-starting electric field strength value.

Third Embodiment

Figure 4:
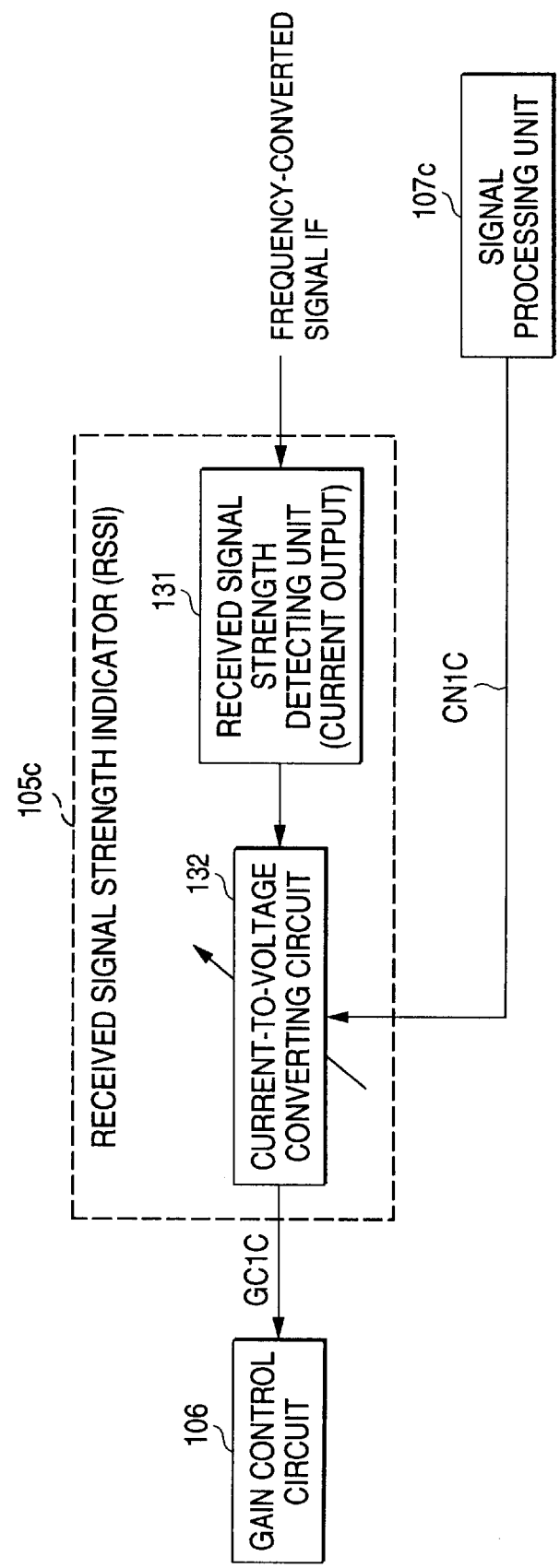
FIG. 4 is a concrete arrangement diagram of a Received Signal Strength Indicator (third embodiment) employed in the wireless receiver of the first embodiment mode.

Further, FIG. 4 shows a concrete arrangement diagram (third embodiment) of the electric field strength detector 105 employed in the wireless receiver according to the first embodiment mode.

In FIG. 4, a Received Signal Strength Indicator (RSSI) 105C of the third embodiment is arranged by employing a received signal strength detecting unit 131 of a current output, and a current-to-voltage converting circuit (converting means) 132.

In the third embodiment, while the output of the received signal strength detecting unit 131 is a current output (namely, current output is varied in response to signal level of signal IF after being frequency-converted), a converting gain of the current-to-voltage converting circuit 132 is switched in response to a control parameter (signal CN1C) supplied from the signal processing unit 107. In other words, the operation-starting electric field strength value of the AGC operation is shifted by selectively setting the converting gain of the current-to-voltage converting circuit 132. It should also be noted that in the case of the third embodiment, the converting gain of the current-to-voltage converting circuit 132 is stored into the memory 108 (not shown in FIG. 4) as the control parameter for setting the operation-starting electric field strength value.

As previously explained, in the wireless receiver and the wireless receiving method of the first embodiment mode, the operation starting electric field strength value of the AGC operation is determined in response to the transfer speed of the reception signal and the number of FM level thereof by selectively setting the reference voltage of the reference voltage switching circuit 112 by selectively setting the gain of the variable gain amplifier 122, or by selectively setting the converting gain of the current-to-voltage converting circuit 132. As a consequence, the optimum operation-starting electric field strength value of the AGC operation can be set in accordance with the sort of signal. The calling rate under such an environment as the strong electric field IM which causes the problem in the actual field can be furthermore improved.

SECOND EMBODIMENT MODE

Figure 5:
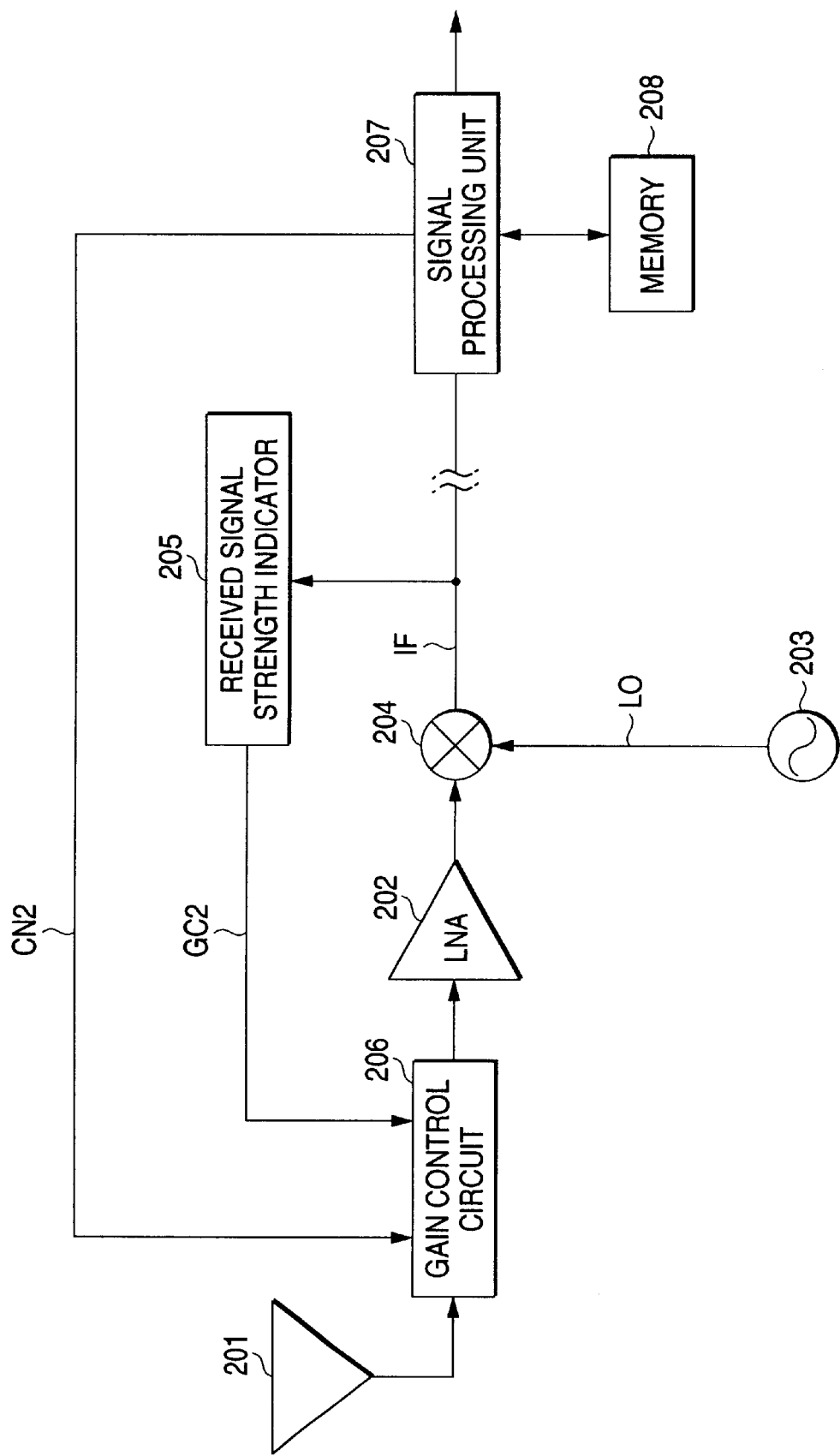
FIG. 5 is a structural diagram of a wireless receiver according to a second embodiment mode of the present invention.

FIG. 5 is a structural diagram for representing a wireless receiver (radio receiver) according to a second embodiment mode of the present invention.

In FIG. 5, the wireless receiver of the second embodiment mode is arranged by employing an antenna 201, a low noise signal amplifier (LNA) 202, a local oscillator circuit 203, a frequency converting circuit 204, a Received Signal Strength Indicator (RSSI) 205, a gain control circuit 206, a signal processing unit 207, and a memory 208.

The antenna 201 receives a signal transmitted from a base station (not shown). The low noise signal amplifier 202 amplifies the signal received by the antenna 201. The frequency converting circuit 204 performs the signal converting operation by multiplying the signal amplified by the low noise signal amplifier 202 by the signal of the local oscillator circuit 203.

The memory 208 corresponds to a storage means. The memory 208 stores thereinto a control parameter of a gain control amount of an automatic gain control. This AGC gain control amount is set/controlled in response to a transfer speed of a reception signal and a number of FM level thereof. The memory 208 further stores thereinto the transfer speed of the reception signal, and the number of FM level thereof. Also, the signal processing unit 207 corresponds to a gain control amount determining means and also a second control means. This signal processing unit 207 decodes the reception signal so as to discriminate the transfer speed of the reception signal and the number of FM level thereof, and outputs a control parameter of a gain control amount in correspondence with the stored transfer speed data and the stored number of FM level data by referring to the storage content of the memory 208 in the form of a signal CN2. Then, the signal processing unit 207 controls the gain setting operation of the gain control circuit 206. It should be understood that a method for detecting the reception signal so as to discriminate the transfer speed of this reception signal and the number of FM level thereof is similar to that of the first embodiment mode. Also, this signal processing unit 207 updates the transfer speed data and the number of FM level data, which are stored in the memory 208, in accordance with the transfer speed of the reception signal and the number of FM level thereof. It should be noted that this data update operation may be carried out every time a signal is received, or may be performed once every time signals are received several times.

Also, when the signal level of the intermediate frequency signal IF after being frequency-converted is higher than, or equal to a certain value, the Received Signal Strength Indicator (RSSI) 205 outputs a signal GC2 to the gain control circuit 206. Furthermore, the gain control circuit 206 switches ON/OFF operations of this gain control circuit 206 in response to the signal GC2 supplied from the Received Signal Strength Indicator (RSSI) 205. It should also be noted that the gain control amount of the gain control circuit 206 is controlled based upon the control parameter (namely, signal CN2) supplied from the signal processing unit 207.

Subsequently, a detailed description will now be made of the arrangement and operations of the gain control means (and second control means) for changing the gain control amount of the AGC operation in response to the transfer speed and the number of FM level of the reception signal. Concrete embodiments of the low noise signal amplifier (LNA) 202 and also of the gain control circuit 206 employed in the wireless receiver according to this second embodiment mode will now be explained in this order of [first embodiment], [second embodiment], [third embodiment], and [fourth embodiment].

First Embodiment

Figure 6:
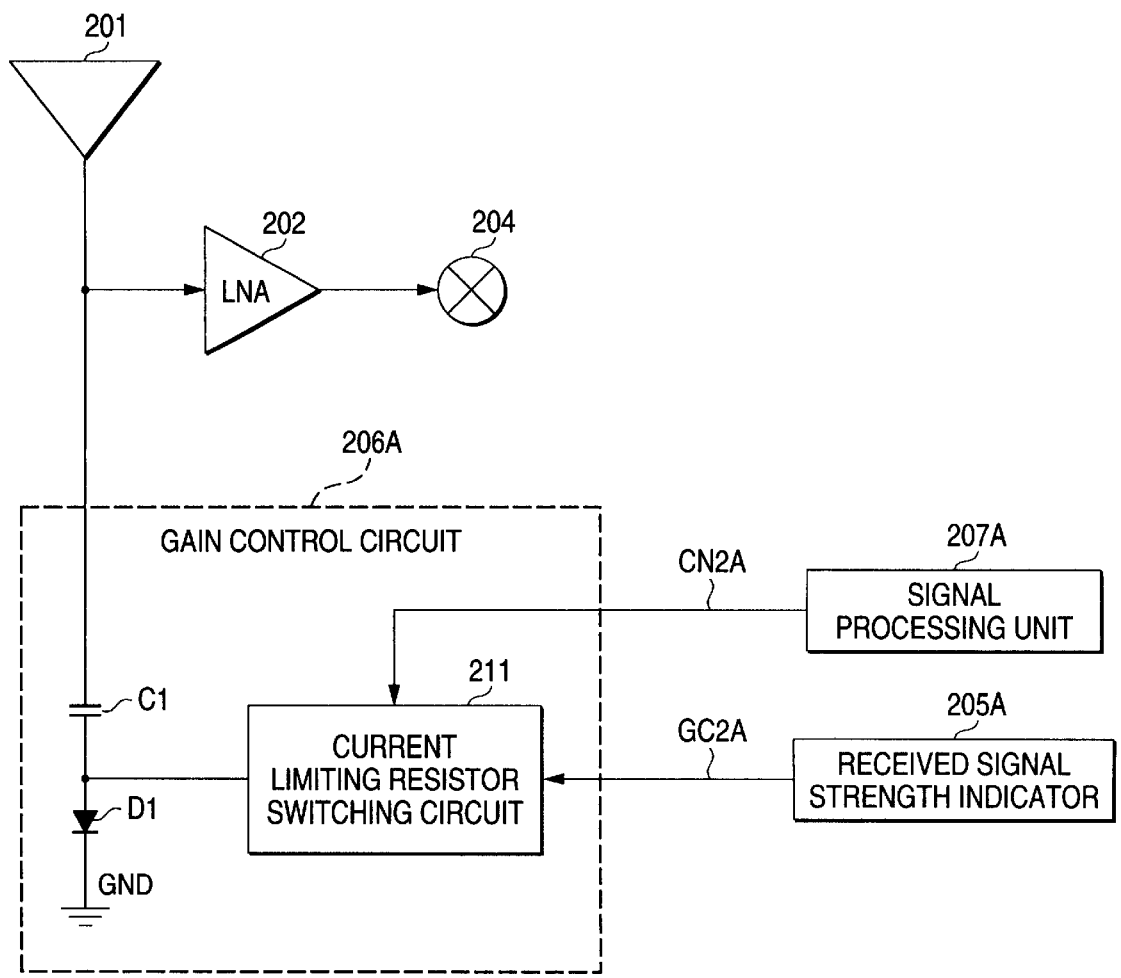
FIG. 6 is a concrete arrangement diagram of a gain control circuit (first embodiment) employed in the wireless receiver of the second embodiment mode.

FIG. 6 represents a concrete arrangement diagram (first embodiment) of the gain control circuit 206 employed in the wireless receiver according to the second embodiment mode.

In FIG. 6, a gain control circuit 206A of the first embodiment is arranged by employing a capacitor C1, a diode D1, and a current limiting resistor switching circuit 211 of this diode D1. The gain control circuit 206A may realize a distributing means.

The capacitor C1 cuts off a DC component of a reception signal as a coupling capacitor, and also may be used as an electronic component for adjusting a gain attenuation amount when the AGC operation is carried out. Normally, as the diode D1, a band switching diode and a PIN diode are used. This diode D1 owns such a characteristic that in connection with increasing of an amount of a current flowing through the diode D1, an impedance between an anode and a cathode of this diode D1 is decreased.

Furthermore, the current limiting resistor switching circuit 211 corresponds to such a circuit that a control parameter (namely, signal CN2A) is supplied from the signal processing unit 207A to this circuit 211, and thus a resistance value thereof is varied. This control parameter responds to a transfer speed of a reception signal and a number of FM level thereof. In other words, the current limiting resistor switching circuit 211 is arranged in such a manner that when the Received Signal Strength Indicator 205A judges that the signal level exceeds a predetermined value, such a voltage appeared in an output signal (signal GC2A) of this Received Signal Strength Indicator 205A may be applied to this current limiting resistor switching circuit 211. The resistance value of the current limiting resistor switching circuit 211 is switched and set in correspondence with the transfer speed of the reception signal and the number of FM level thereof. As a result, the value of such a current which flows via the diode D1 to the ground (GND) may be varied so as to switch the gain control amount of the AGC operation. That is to say, if the resistance value of the current limiting resistor switching circuit 211 is decreased, then the current conducted into the diode D1 is increased to thereby increase the gain control amount of the AGC operation. Conversely, if the resistance value of the current limiting resistor switching circuit 211 is increased, then the current conducted into the diode D1 is decreased to thereby decrease the gain control amount of the AGC operation.

Figure 7:
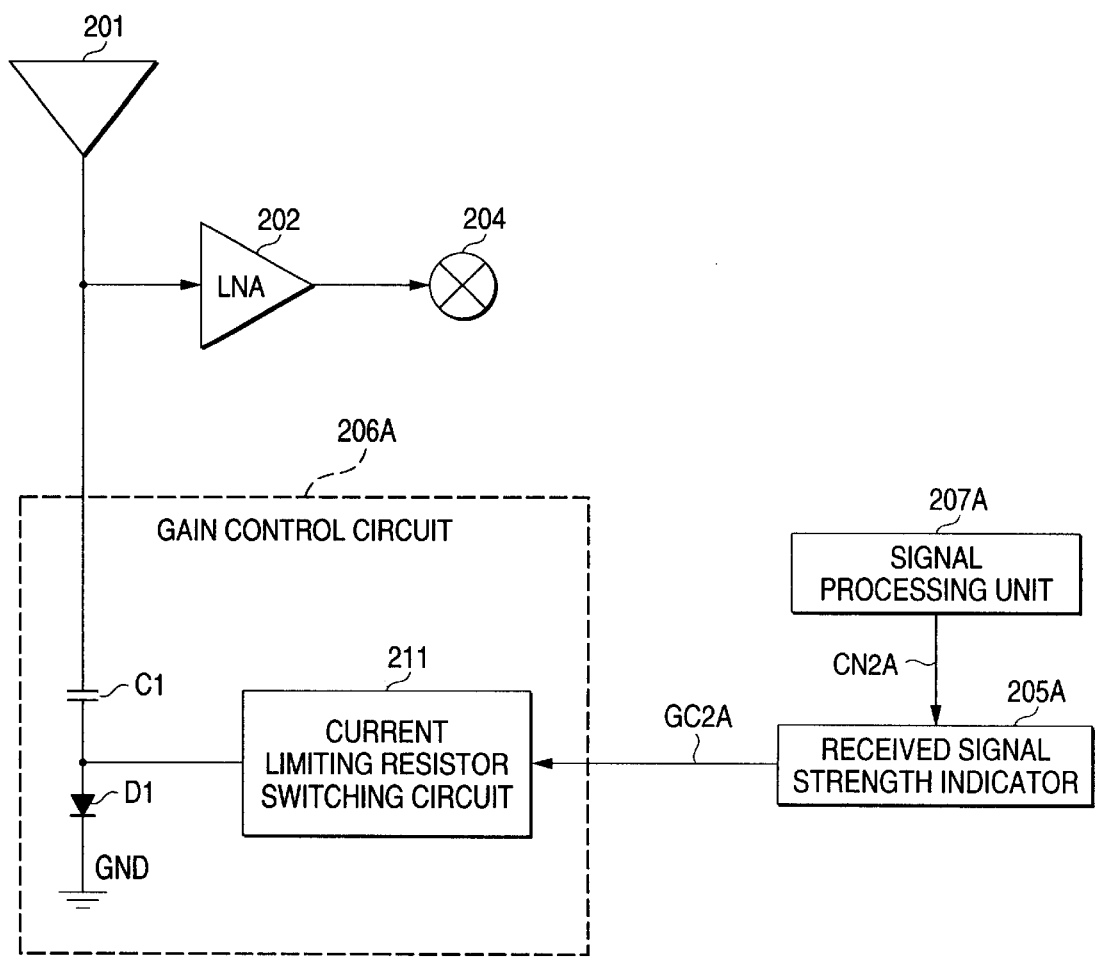
FIG. 7 is a concrete arrangement diagram of a gain control circuit (first embodiment) employed in the wireless receiver of the second embodiment mode.

Also, as shown in FIG. 7, a similar gain control operation may be carried out. That is, the resistance value of the current limiting resistor switching circuit 211 is not switched based upon the transfer speed of the received signal and the number of FM level thereof. Alternatively, the output voltage (signal GC2A) of the Received Signal Strength Indicator 205A may be switched. If the output voltage of the Received Signal Strength Indicator 205A is increased, then the current conducted to the diode D1 may be increased. Conversely, when the output voltage of the Received Signal Strength Indicator 205A is decreased, the current conducted to the diode D1 may be decreased.

Second Embodiment

Figure 8:
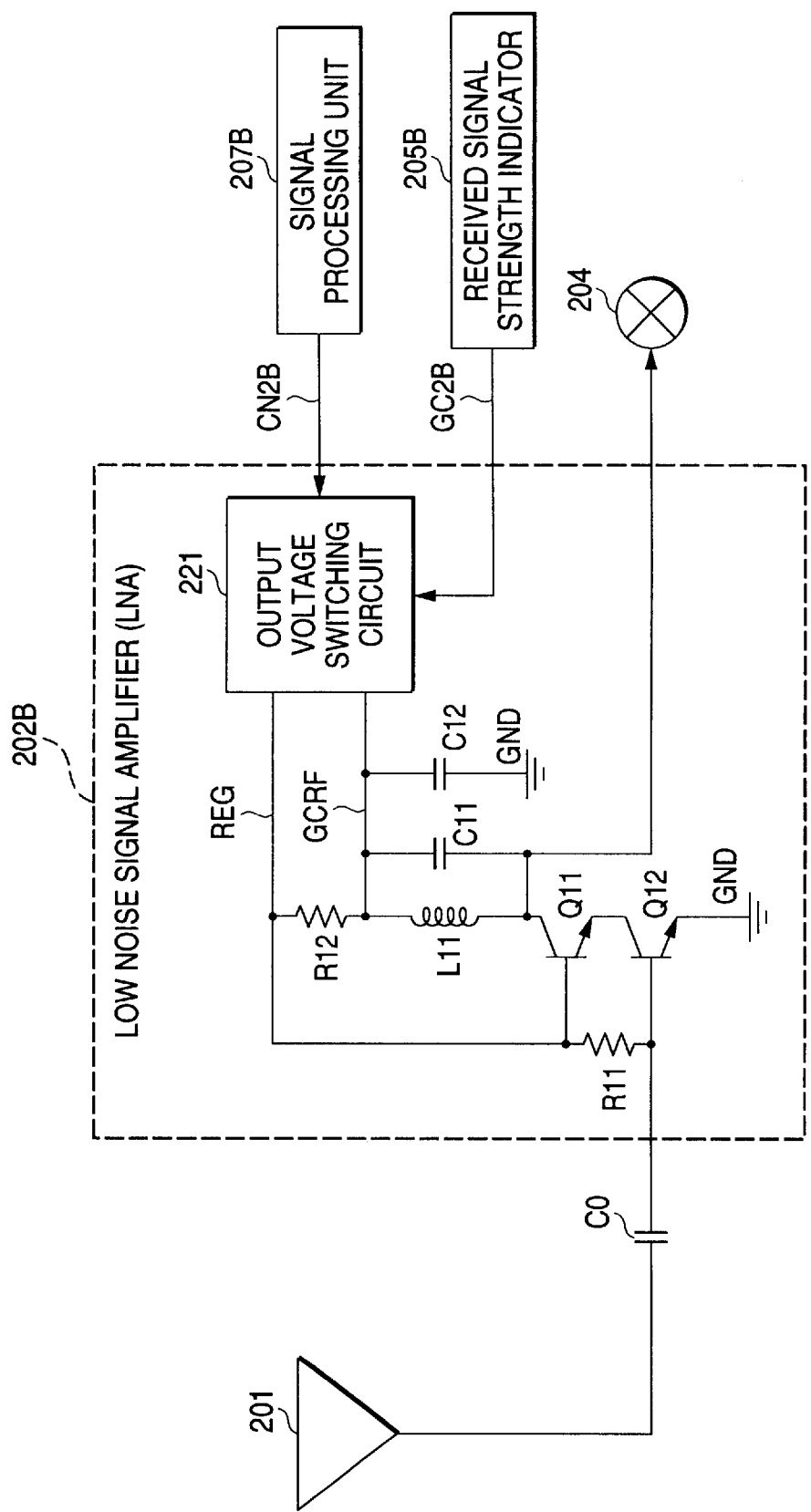
FIG. 8 is a concrete arrangement diagram of a low noise signal amplifier (second embodiment) employed in the wireless receiver of the second embodiment mode.

Next, FIG. 8 shows a concrete arrangement diagram (second embodiment) of the low noise signal amplifier (LNA) 202 employed in the wireless receiver according to the second embodiment mode. In the first embodiment, the arrangement for controlling the gain by utilizing the switching characteristic of the diode D1 has been explained. As shown in the second embodiment of FIG. 8, a current value of a low noise signal amplifier (LNA) 202B is switched, so that the gain control amount of the AGC operation may be switched.

In FIG. 8, the low noise signal amplifier (LNA) 202B of the second embodiment is arranged by employing transistors Q11, Q12; resistors R11, R12; capacitors C11, C12; an inductance L11; and an output voltage switching circuit 221. This low noise signal amplifier 202B may realize a gain control means.

When the Received Signal Strength Indicator 205B judges that a signal level exceeds a predetermined value, this fact is notified to an output voltage switching circuit 221 in the form of a signal GC2B. In response to a control parameter (signal CN2B) responding to the transfer speed of the reception signal and the number of FM level thereof, which is supplied from the signal processing unit 207B, the output voltage switching circuit 221 switches a voltage value of GCRF of this output voltage switching circuit 221.

The current value of the low noise signal amplifier (LNA) 202B is determined by such a value obtained by dividing a difference between this voltage value "GCRF" and another output voltage "REG" of the output voltage switching circuit 221 by the resistance value of the resistor R12. As a result, since the voltage value GCRF of the output voltage switching circuit 221 is switched, the gain of the low noise signal amplifier (LNA) 202B can be controlled. In other words, if the voltage value GCRF of the output voltage switching circuit 221 is controlled in such a manner that a potential difference between these output voltages GCRF and REG is decreased, then the current value of the low noise signal amplifier (LNA) 202B also becomes small, so that the gain of this low noise signal amplifier (LNA) 202B is decreased. Conversely, if the voltage value GCRF of the output voltage switching circuit 221 is controlled in such a manner that the potential difference between these output voltages GCRF and REG is increased, then the current value of the low noise signal amplifier (LNA) 202B also becomes large, so that the gain of this low noise signal amplifier (LNA) 202B is increased.

Third Embodiment

Figure 9:
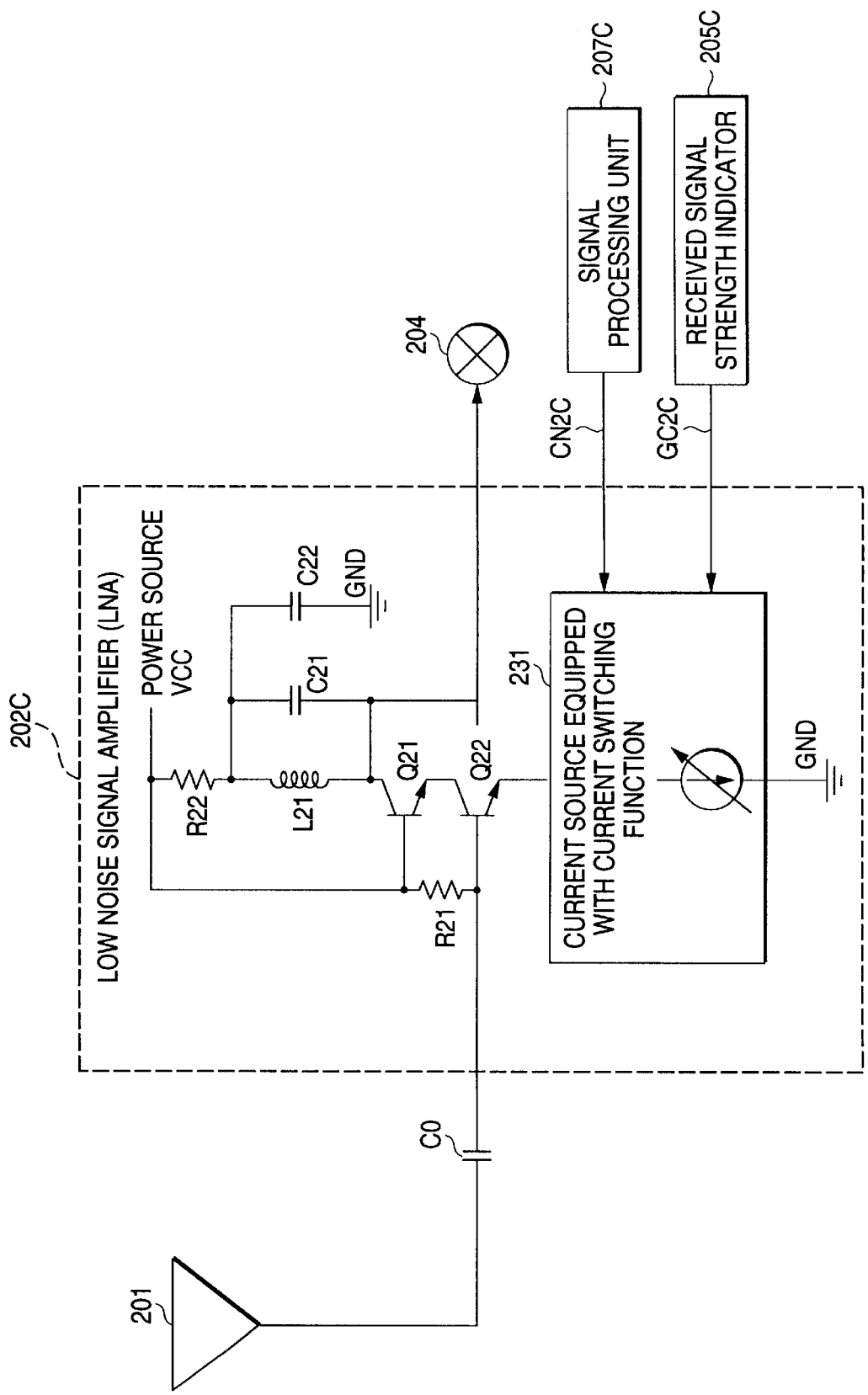
FIG. 9 is a concrete arrangement diagram of a low noise signal amplifier (third embodiment) employed in the wireless receiver of the second embodiment mode.

Next, FIG. 9 shows a concrete arrangement diagram (third embodiment) of the low noise signal amplifier (LNA) 202 employed in the wireless receiver according to the second embodiment mode.

In FIG. 9, a low noise signal amplifier (LNA) 202C of the third embodiment is arranged by employing transistors Q21, Q22; resistors R21, R22; capacitors C21, C22; and inductance L21; and a current source 231 equipped with a current switching function. This low noise signal amplifier 202C may realize a gain control means.

Similar to the second embodiment, also in the third embodiment, the gain control is performed by switching the current of the low noise signal amplifier (LNA) 202C. As represented in FIG. 9, the current value of the low noise signal amplifier (LNA) 202C is switched by switching the current source of the current source 231 equipped with the current switching function. In other words, when the Received Signal Strength Indicator 205C judges that a signal level exceed a predetermined value, this fact is notified to the current source 231 equipped with the current switching function in the form of a signal GC2C. In response to a control parameter (signal CN2C) responding to the transfer speed of the reception signal and the number of FM level thereof, which is supplied from the signal processing unit 207C, the current source of this current source 231 equipped with the current switching function is switched/set, so that the current value of the low noise signal amplifier (LNA) 202C is switched.

Fourth Embodiment

Figure 10:
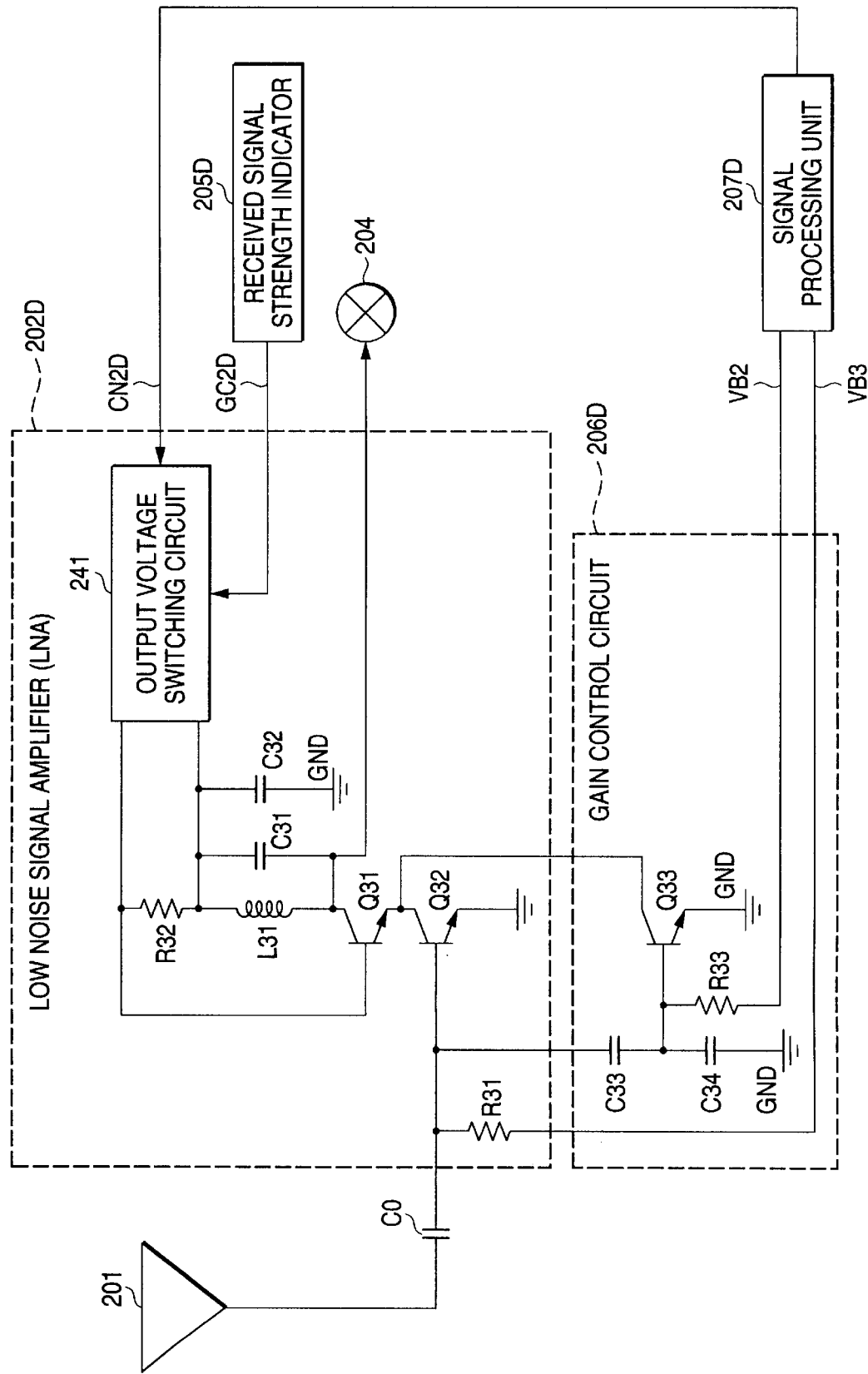
FIG. 10 is a concrete arrangement diagram of a low noise signal amplifier and a gain control circuit (fourth embodiment) employed in the wireless receiver of the second embodiment mode.

Further, FIG. 10 shows a concrete arrangement diagram (fourth embodiment) of the low noise signal amplifier (LNA) 202 and the gain control circuit 206 employed in the wireless receiver according to the second embodiment mode.

In FIG. 10, a low noise signal amplifier (LNA) 202D of the third embodiment is arranged by employing transistors Q31, Q32; resistors R31, R32; capacitors C31, C32; an inductance L31; and an output voltage switching circuit 241. The gain control circuit 206D is arranged by employing a transistor Q33, a resistor R33, and capacitors C33 and C34.

The arrangement of the fourth embodiment becomes effective in such a case that a large gain control amount is furthermore required. As shown in FIG. 10, the circuit is arranged in such a manner that since the transistor Q32 of the low noise signal amplifier 202D is changed to the transistor (namely, transistor equipped with attenuator) Q33 for AGC operation of the gain control circuit 206D while the AGC operation is carried out, the gain control amount is increased. Also, similar to the second embodiment (FIG. 8), a current value of the low noise signal amplifier (LNA) 202D is controlled by selectively setting the output voltage switching circuit 241 in response to the transfer speed of the reception signal and the number of FM level thereof, so that the gain control amount is controlled in a fine mode.

In this case, the capacitor C33 and C34 of the gain control circuit 206D constitute an attenuator. Thus, when the capacitances of these capacitors C33 and C34 are adjusted in correspondence with a necessary gain control amount, the attenuation amount achieved during the AGC operation may be adjusted. Also, both the transistor Q32 of the low noise signal amplifier 202D and the transistor Q33 for AGC operation (transistor equipped with attenuator) of the gain control circuit 206D are controlled in such a manner that any one of these transistors Q32 and Q33 is brought into an ON state in response to base bias control signals VB2 and VB3 supplied from the signal processing unit 207D, respectively.

In the case that an electric field strength level of a reception signal is low and also an electric field strength level of a reception signal is detected, the base bias (signal VB3) of the transistors Q32 of the low noise signal amplifier 202D is ON-controlled and also the base bias (signal VB2) of the transistor Q33 for AGC operation of the gain control circuit 206D is OFF-controlled, so that the automatic gain control circuit is OFF-controlled. Also, in the case that an received signal strength level of a reception signal is high the base bias of the transistor Q32 of the low noise signal amplifier 202D is OFF-controlled and also the base bias of the transistor Q33 for AGC operation of the gain control circuit 206D is ON-controlled, so that the automatic gain control circuit is ON-controlled, since the transistors are switched.

It should be understood that when the automatic gain control circuit is turned ON, similar to the second embodiment (FIG. 8), the gain control amount can be selectively set in correspondence with the transfer speed of the reception signal and also the number of FM level thereof by selectively setting the output voltage switching circuit 241 so as to control the value of the current flowing through the resistor R32.

As previously explained, in the wireless receiver and the wireless receiving method of the second embodiment mode, the gain control amount of the AGC operation is determined in response to the transfer speed of the reception signal and the number of FM level thereof by selectively setting the resistance value of the current limiting resistor switching circuit 211 shown in FIG. 6, by selectively setting the output voltage of the Received Signal Strength Indicator 205A shown in FIG. 7, by selectively setting the output voltage values of the output voltage switching circuit 221 shown in FIG. 8 and the output voltage switching circuit 241 shown in FIG. 10, or by selectively setting the current source of the current source 231 equipped with the current switching function shown in FIG. 9. As a consequence, the optimum gain control amount of the AGC operation can be set in accordance with the sort of signal. The calling rate under such an environment as the strong electric field IM which causes the problem in the actual field can be furthermore improved.

THIRD EMBODIMENT MODE

Figure 11:
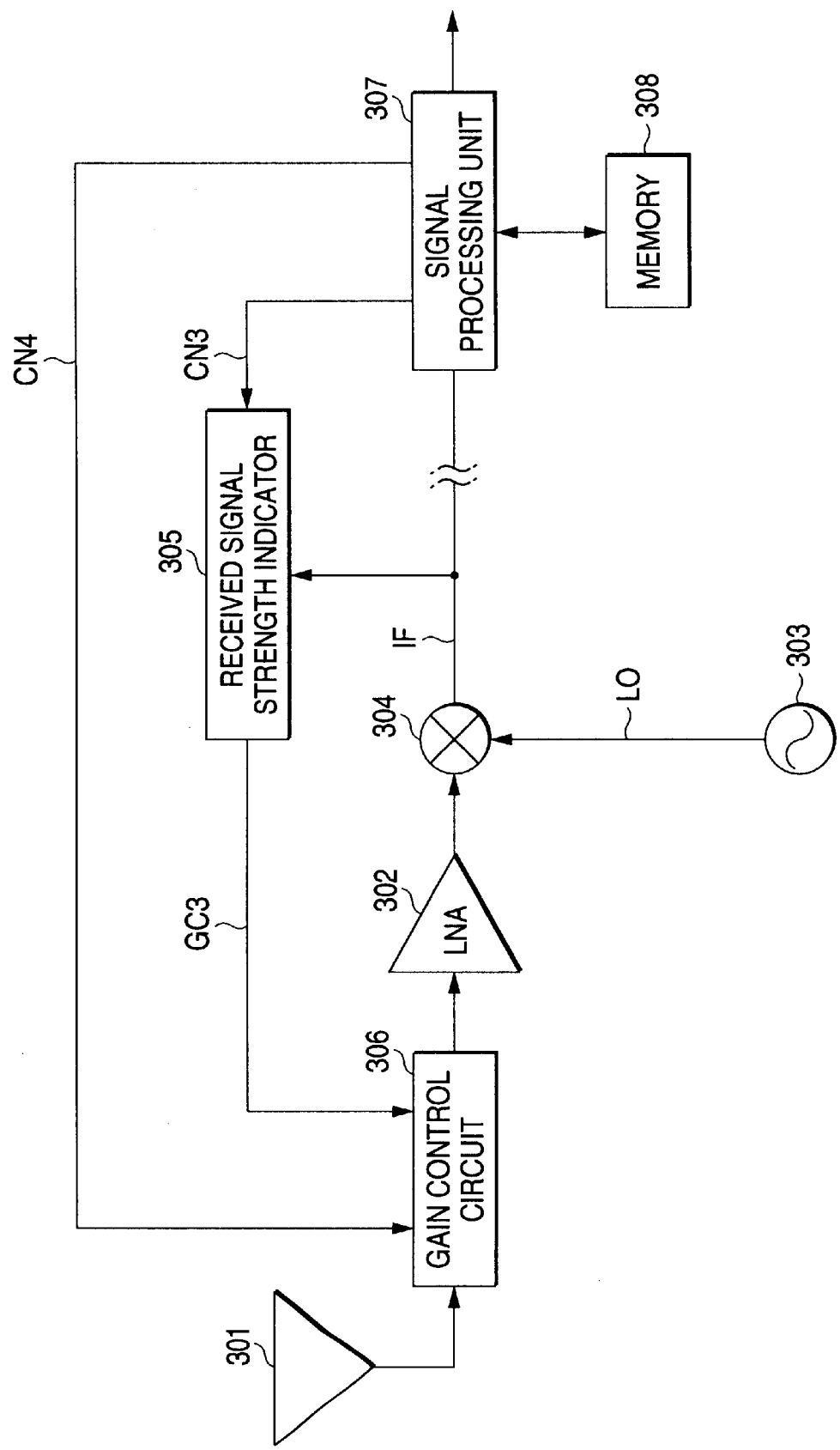
FIG. 11 is a structural diagram of a wireless receiver according to a third embodiment mode of the present invention.
Figure 12:
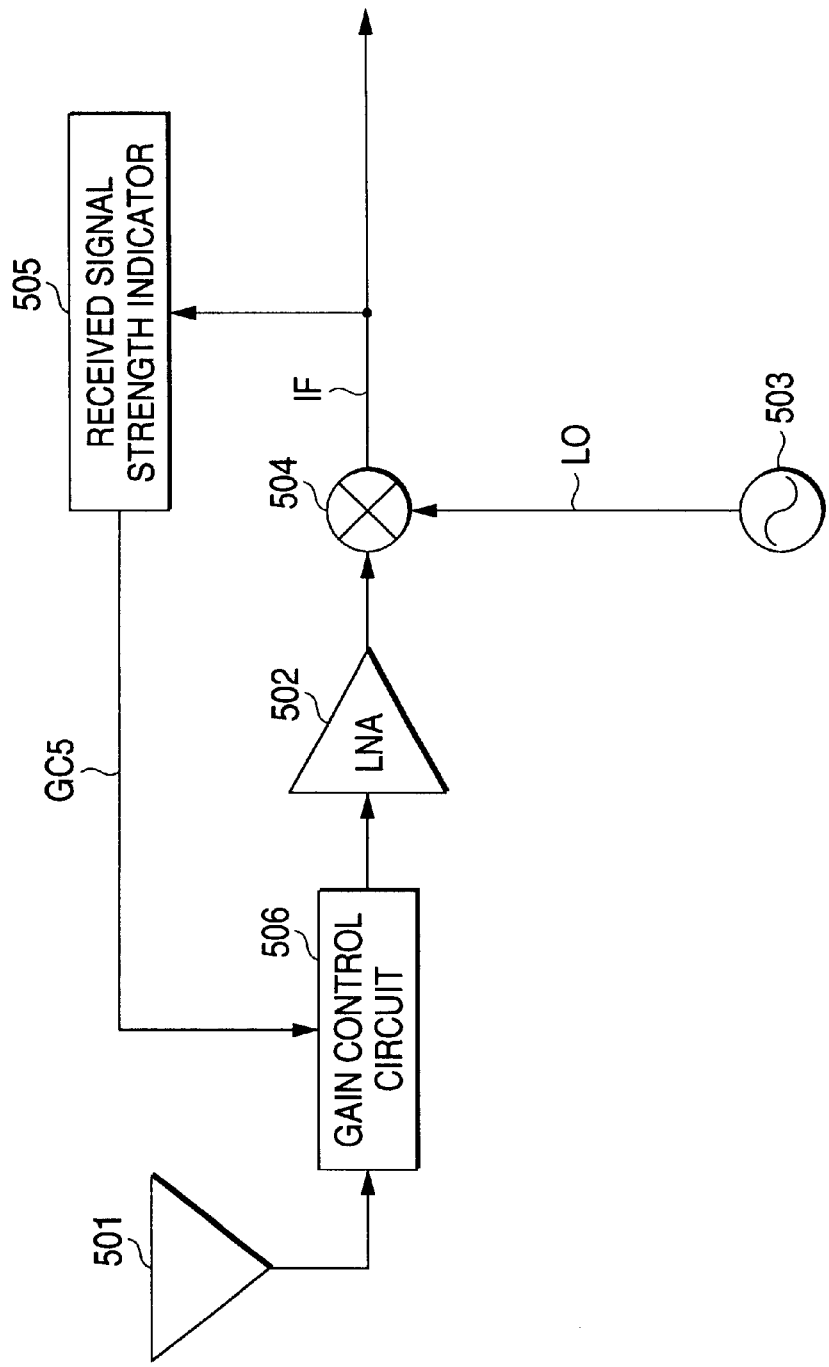
FIG. 12 is a structural diagram for showing the conventional wireless receiver (first prior art) equipped with the continuous gain control type automatic gain control circuit.
Figure 13:
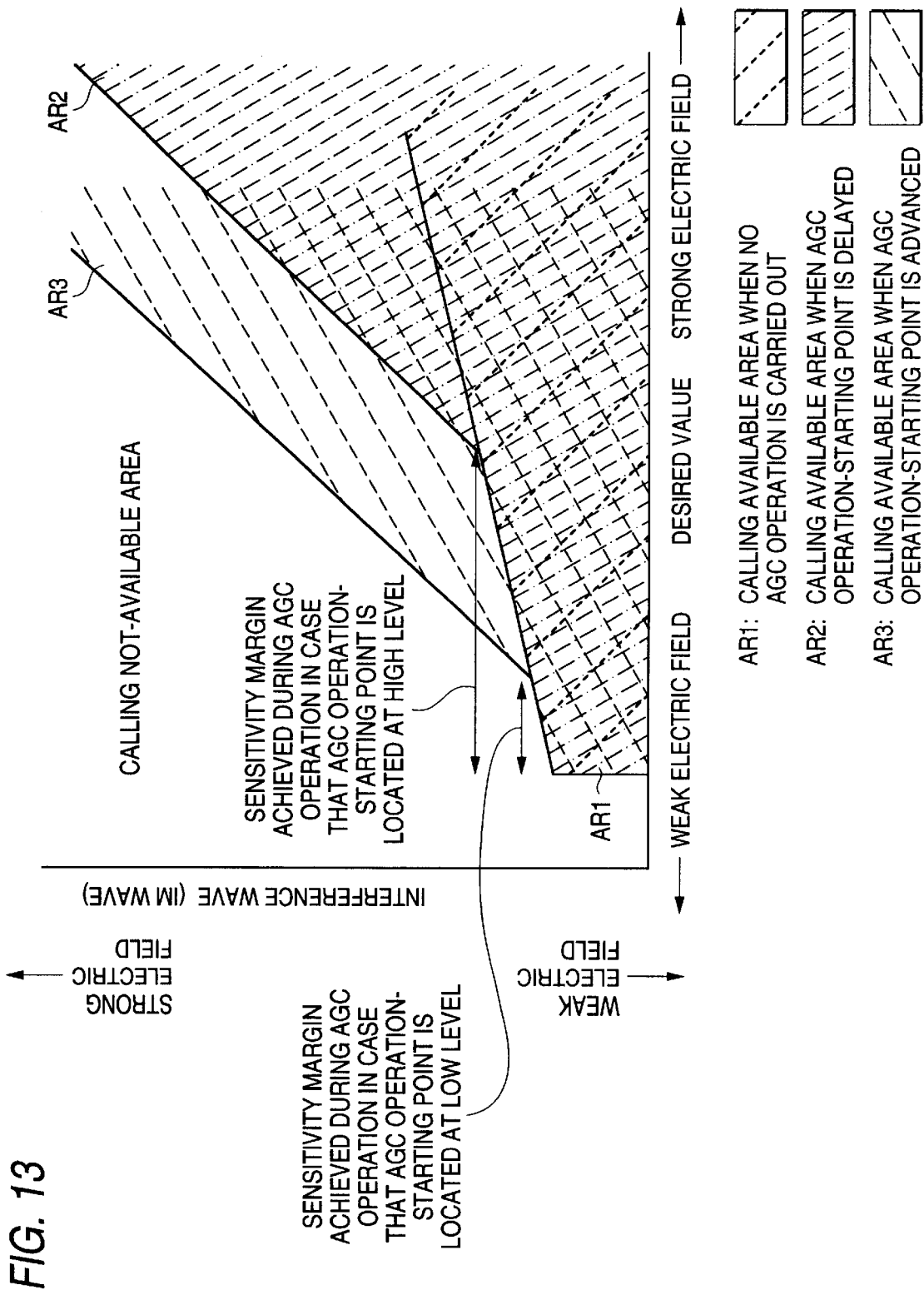
FIG. 13 is an explanatory diagram for representing the relationship among the AGC operation-starting electric field strength value, the IM characteristic, and the sensitivity margin during AGC operation in the continuous gain control type automatic gain control circuit.
Figure 14:
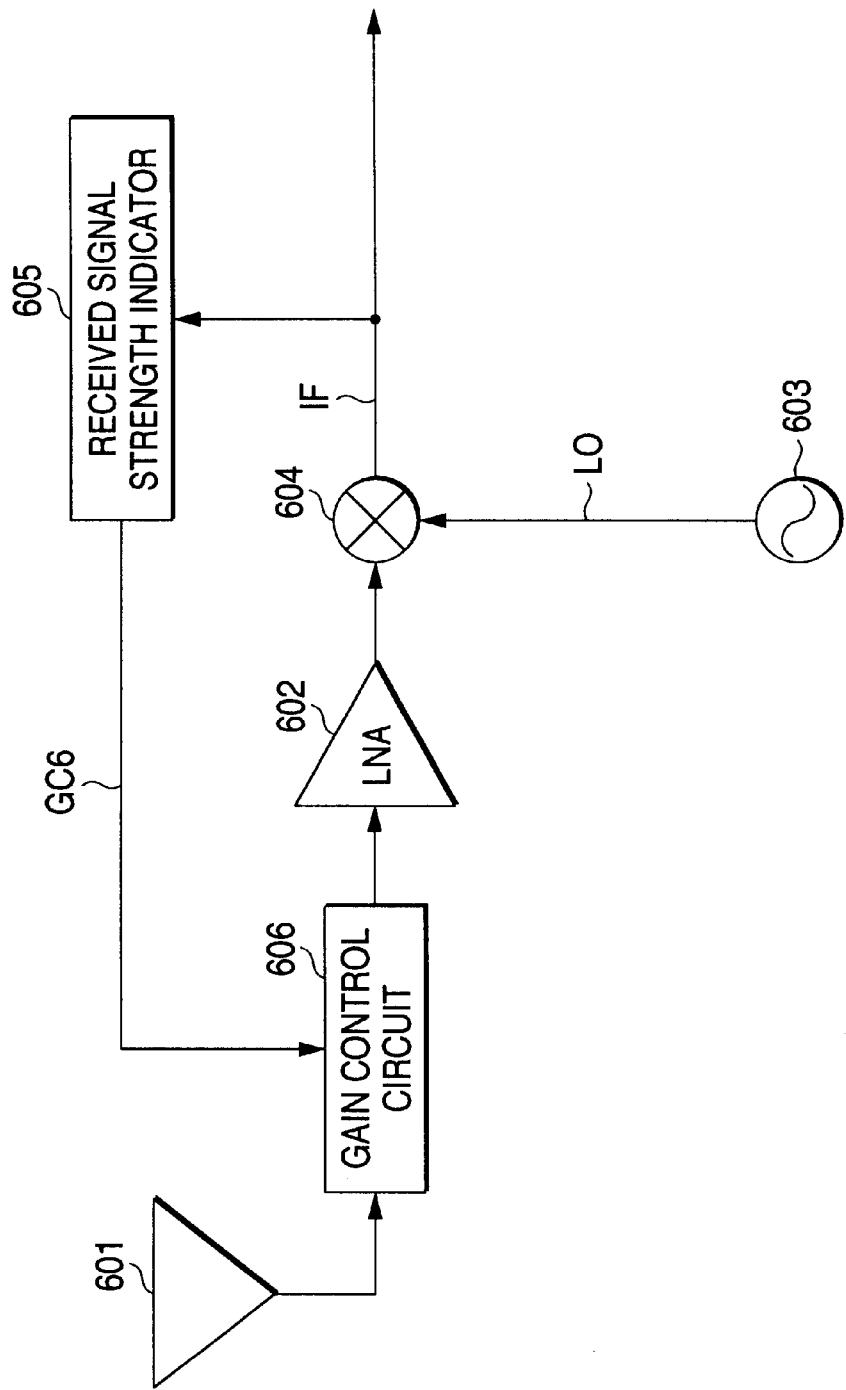
FIG. 14 is a structural diagram for showing the conventional wireless receiver (second prior art) equipped with the stepped control type automatic gain control circuit.

FIG. 11 is a structural diagram for representing a wireless receiver (radio receiver) according to a third embodiment mode of the present invention.

In this drawing, the wireless receiver of this third embodiment mode is arranged by employing an antenna 301, a low noise signal amplifier (LNA) 302, a local oscillator circuit 303, a frequency converting circuit (Mixer) 304, a Received Signal Strength Indicator (RSSI) 305, a gain control circuit 306, a signal processing unit 307, and a memory 308.

The antenna 301 receives a signal transmitted from a base station (not shown). The low noise signal amplifier 302 amplifies the signal received by the antenna 301. The frequency converting circuit 304 performs the signal converting operation by multiplying the signal amplified by the low noise signal amplifier 302 by the signal of the local oscillator circuit 303.

The memory 308 corresponds to a storage means. The memory 308 stores thereinto a control parameter of an operation-starting electric field strength value of an automatic gain control and a control parameter of a gain control amount. Both the operation-starting electric field strength value and the gain control amount are set/controlled in correspondence with a transfer speed of a reception signal and a number of FM level thereof. This memory 308 further stores thereinto the transfer speed of the reception signal, and the number of FM level thereof. Also, the signal processing unit 307 corresponds to an operation-starting field strength value determining means, a gain control amount determining means, and a second control means. This signal processing unit 307 decodes the reception signal so as to discriminate the transfer speed of the reception signal and the number of FM level thereof, and outputs a control parameter of an operation-starting electric field strength value and a control parameter of a gain control amount in correspondence with the stored transfer speed data and the stored number of FM level data by referring to the storage content of the memory 308 in the form of a signal CN3 and a signal CN4. Then, the signal processing unit 307 controls the Received Signal Strength Indicator (RSSI) 305 and the gain control circuit 306 by supplying the signals CN3 and CN4 to this indicator 305 and the gain control circuit 306. It should also be noted that the method for decoding the reception signal to discriminate the transfer speed and the number of FM level is similar to that of the first embodiment mode.

Also, the Received Signal Strength Indicator (RSSI) 305 corresponds to both an received signal strength detecting means and a first control means. When in response to the control parameter (signal CN3) an electric field strength of a signal reaches the operation-starting electric field value, the Received Signal Strength Indicator (RSSI) 305 changes a voltage of an output signal GC3 in correspondence with a signal level of an intermediate frequency signal IF after being frequency-converted, to thereby output the changed output voltage GC3 to the gain control circuit 306. Furthermore, the ON/OFF operation of the gain control circuit 306 is switched in response to the signal GC3 supplied from the Received Signal Strength Indicator (RSSI) 305, whereas the gain control amount is controlled based upon the control parameter (signal CN4) supplied from the signal processing unit 307 and the signal GC3 derived from the Received Signal Strength Indicator (RSSI) 305.

Similar to the first embodiment mode, also, in this embodiment mode, the first embodiment, the second embodiment, or the third embodiment may be supplied as a concrete embodiment of the Received Signal Strength Indicator 305. Furthermore, similar to the second embodiment mode, the first, second, third, or fourth embodiment may be applied as a concrete embodiment of both the low noise signal amplifier (LNA) 302 and the gain control circuit 306.

In accordance with the arrangements of these applied embodiments, both a control parameter of the operation-starting electric field strength value of the AGC operation and another control parameter of the gain control amount are stored into the memory 308, which should be set/controlled in correspondence with the transfer speed of the reception signal and the number of FM level thereof. Normally, a ROM (read-only memory) may be employed as the memory 308. Since data saved in this ROM are rewritten, setting of the AGC operation-starting electric field strength value and also setting of the gain control amount may be changed as to the individual transfer speed and the individual number of FM levels in connection with the conditions of the real field.

Also, the control parameters saved in the memory 308 are set based upon fluctuations in the gain characteristic, the intermodulation sensitivity suppressing characteristic, and the electric field strength characteristic. These characteristics are individually tested when this wireless receiver is shipped. As a consequence, the AGC operation-starting electric field strength value and also the gain control amount can be set under optimum setting conditions in conjunction with the conditions of the real field in correspondence with the transfer speed of the reception signal and the number of FM level thereof.

Further, in this embodiment, the heterodyne type reception system has been described. Alternatively, the wireless receiver according to the present invention may be similarly realized by introducing other types of reception systems such as the direct conversion type reception system. There is no limitation in the reception system.

As previously described, in accordance with the wireless receiver, the wireless receiving method, and the recording medium of the present invention, the operation-starting field value determining means (determining step) determines such an operation-starting electric field strength value by which the gain control operation of the wireless receiver by the gain control means is commenced in response to the transfer speed of the reception signal and the number of FM level of the reception signal. Also, the first controlmeans (control step) causes the gain control means to commence the gaincontrol operation when the electric field strength detected by the received signal strength detecting means reaches the operation-starting field strength value. As a consequence, the automatic gain control operation starting electric field strength value and the gain control amount of autmatic gain control operation can be set under optimum condition, depending upon the sort of reception signal. It is possible to provide the wireless receiver, the wireless receiving method, and the recording medium, capable of furthermore improving the calling rate under such an environment as the strong electric field IM which causes the problem in the actual field.

Also, in accordance with the present invention, the gain control amount determining means (determining step) determines the gain control amount of the gain control means in response to the transfer speed of the reception signal and the number of FM level of the reception signal, and the second control means (control step) changes the gain of the gain control means in response to the gain control amount. As a consequence, the gain control amount of the automatic gain control operation can be set under optimum condition, depending upon the sort of reception signal. It is possible to furthermore improve the calling rate under such an environment as the strong electric field IM which causes the problem in the actual field.

Also, in accordance with the present invention, the below-mentioned parameter is saved in the storage means in correspondence with the transfer speed of the reception signal and the number of FM level thereof. The parameter may set and control the operation-starting electric field strength value, the gain control amount, the predetermined reference voltage of the comparing means, the predetermined gain of the variable gain amplifier, the preselected rate of the converting means, the distribution ratio of the distributing means to the signal amplifying means, the output voltage of the gain controlling output voltage switching circuit of the signal amplifying means, or the current value selection of the current source having the current switching function of the signal amplifying means. As a consequence, the automatic gain control operation starting electric field strength value and the gain control amount can be readily set under optimum condition, depending upon the transfer speed and the number of FM level of reception signal. It is possible to furthermore improve the calling rate under such an environment as the strong electric field IM.

Furthermore, in accordance with the present invention, the parameter of the storage means is individually adjusted based upon the gain characteristic of the wireless receiver, the intermodulation sensitivity suppressing characteristic thereof, or the electric field strength characteristic thereof. As a result, the automatic gain control operation-starting electric field strength value and also the gain control amount can be set under optimum conditions in correspondence with the transfer speed of the reception signal and the number of FM level thereof in fit with the actual field state.

What is claimed is:

1. A wireless receiver comprising:
   gain control means for controlling a gain of the wireless receiver;
   received signal strength detecting means for detecting an electric field strength of a reception signal;
   operation-starting electric field electric value determining means for determining an operation-starting electric field strength value by which the gain control operation of said gain control means is commenced in response to a transfer speed of said reception signal and a number of FM level of said reception signal; and
   first control means for causing said gain control means to commence the gain control operation when an electric field strength detected by said received signal strength detecting means reaches said operation-starting electric field strength value.

2. A wireless receiver as claimed in claim 1, wherein said gain control means is a stepped gain control type gain control means for changing the gain only by a predetermined gain amount when a signal level of said reception signal exceeds a predetermined level.

3. A wireless receiver as claimed in claim 1, wherein said gain control means is a continuous gain control type gain control means for changing the gain in response to a signal level of said reception signal.

4. A wireless receiver as claimed in claim 1 wherein said first control means includes:
   comparing means for comparing the electric field strength detected by said received signal strength detecting means with a preselected reference value; and
   said preselected reference voltage of said comparing means is selectively set in response to the transfer speed of said reception signal and the number of FM level thereof.

5. A wireless receiver as claimed in claim 1 wherein said first control means includes:
   a variable gain amplifier for amplifying said reception signal by a predetermined gain to supply the amplified reception signal to said received signal strength detecting means; and
   said predetermined gain of said variable gain amplifier is selectively set in response to the transfer speed of said reception signal and the number of FM level thereof.

6. A wireless receiver as claimed in claim 1, wherein said first control means includes:
   converting means for converting the output of said received signal strength detecting means into a voltage level at a predetermined rate; and
   said predetermined rate of said converting means is selectively set in response to the transfer speed of said reception signal and the number of FM level thereof.

7. A wireless receiver comprising:
   gain control means for controlling a gain of the wireless receiver;
   gain control amount determining means for determining a gain control amount of said gain control means in response to a transfer speed of a reception signal and a number of FM level of said reception signal; and
   second control means for changing the gain of said gain control means in response to said gain control amount.

8. A wireless receiver as claimed in claim 7, wherein said gain control means is a stepped gain control type gain control means for changing the gain only by a predetermined gain amount when a signal level of said reception signal exceeds a predetermined level.

9. A wireless receiver as claimed in claim 7, wherein said gain control means includes:
   signal amplifying means for amplifying a reception signal; and
   distributing means for distributing a reception signal received from an antenna to both said signal amplifying means and another signal path; and
   said second control means changes a distribution ratio of said reception signal with respect to said signal amplifying means in said distributing means in response to the transfer speed of said reception signal and the number of FM level thereof.

10. A wireless receiver as claimed in claim 7, wherein said gain control means includes:
    signal amplifying means, the gain of which is controlled by an output voltage switching circuit capable of selectively setting an output voltage; and
    said second control means controls the gain of said signal amplifying means by selectively setting the output voltage of said output voltage switching circuit in response to the transfer speed of said reception signal and the number of FM level thereof.

11. A wireless receiver as claimed in claim 7, wherein said gain control means includes:

signal amplifying means equipped with a current source having a current switching function; and said second control means selectively sets the current value of said current source having the current switching function of said signal amplifying means in response to the transfer speed of said reception signal and the number of FM level thereof.

12. A wireless receiver comprising:

gain control means for controlling a gain of the wireless receiver; and storage means for storing therein a parameter used to set/control either an operation-starting electric field strength value by which the gain control operation of said gain control means or a gain control amount of said gain control means in response to a transfer speed of a reception signal and a number of FM level thereof.

13. A wireless receiver as claimed in claim 12, wherein said parameter of the storage means is individually adjusted based upon a gain characteristic of said wireless receiver, an intermodulation sensitivity suppressing characteristic thereof, or an electric field strength characteristic thereof.

14. A wireless receiving method of a wireless receiver equipped with gain control means for controlling a gain of the wireless receiver, and received signal strength detecting means for detecting an electric field strength of a reception signal, comprising the steps of:

determining an operation-starting electric field strength value by which the gain control operation of said gain control means is commenced in response to a transfer speed of said reception signal and a number of FM level of said reception signal; and causing said gain control means to commence the gain control operation when an electric field strength detected by said received signal strength detecting means reaches said operation-starting electric field strength value.

15. A wireless receiving method as claimed in claim 14 further comprising a step of:

storing thereinto a parameter for setting/controlling either said operation-starting electric field strength value or said gain control amount in response to the transfer speed of the reception signal and the number of FM level thereof.

16. A wireless receiving method as claimed in claim 15, wherein said parameter of the storage step is individually adjusted based upon a gain characteristic of said wireless receiver, an intermodulation sensitivity suppressing characteristic thereof, or an electric field strength characteristic thereof.

17. A wireless receiving method of a wireless receiver equipped with gain control means for controlling a gain of the wireless receiver, comprising the steps of:

determining a gain control amount of said gain control means in response to a transfer speed of a reception signal and a number of FM level of said reception signal; and changing the gain of said gain control means in response to said gain control amount.

18. A wireless receiving method as claimed in claim 17, further comprising the step of:

storing thereinto a parameter for setting/controlling said gain control amount in response to the transfer speed of the reception signal and the number of FM level thereof.

19. A wireless receiving method as claimed in claim 18, wherein said parameter of the storage step is individually adjusted based upon a gain characteristic of said wireless receiver, an intermodulation sensitivity suppressing characteristic thereof, or an electric field strength characteristic thereof.

20. A recording medium for recording thereon a wireless receiving method of a wireless receiver equipped with gain control means for controlling a gain of the wireless receiver, and number of received signal strength detecting means for detecting an electric field strength of a reception signal as a program to be executed by a computer and readable by the computer, the wireless receiving method comprising:

an operation-starting electric field value determining step for determining an operation-starting electric field strength value by which the gain control operation of said gain control means is commenced in response to a transfer speed of said reception signal and a number of FM level of said reception signal; and a first control step for causing said gain control means to commence the gain control operation when an electric field strength detected by said received signal strength detecting means reaches said operation-starting electric field strength value.

21. A recording medium for recording thereon a wireless receiving method of a wireless receiver equipped with gain control means for controlling a gain of the wireless receiver as a program to be executed by a computer and readable by the computer, the wireless receiving method comprising:

a gain control amount determining step for determining a gain control amount of said gain control means in response to a transfer speed of a reception signal and a number of FM level of said reception signal; and a second control step for changing the gain of said gain control means in response to said gain control amount.

* * * * *